(12) United States Patent
Schrittwieser

(10) Patent No.: US 12,048,098 B2
(45) Date of Patent: Jul. 23, 2024

(54) COMPONENT CARRIER WITH EMBEDDED COMPONENT CONNECTED BY GALVANIC CONNECTION STACK

(71) Applicant: AT&S Austria Technologie & Systemtechnik Aktiengesellschaft, Leoben (AT)

(72) Inventor: Wolfgang Schrittwieser, Kapfenberg (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 17/660,741

(22) Filed: Apr. 26, 2022

(65) Prior Publication Data

US 2022/0353997 A1 Nov. 3, 2022

(30) Foreign Application Priority Data

Apr. 29, 2021 (EP) .................................... 21171387
Jul. 14, 2021 (DE) ......................... 102021118202.6

(51) Int. Cl.
*H05K 1/18* (2006.01)
*H05K 1/09* (2006.01)

(52) U.S. Cl.
CPC .............. *H05K 1/182* (2013.01); *H05K 1/09* (2013.01)

(58) Field of Classification Search
CPC ............. H05K 1/18; H05K 1/182; H05K 1/09
USPC ........................................................ 361/761
See application file for complete search history.

(56) References Cited

U.S. PATENT DOCUMENTS

| 7,134,198 B2 | 11/2006 | Nakatani et al. |
| 2008/0315375 A1 | 12/2008 | Eichelberger et al. |
| 2016/0240498 A1 | 8/2016 | Cai et al. |
| 2020/0083173 A1* | 3/2020 | Weidinger .......... H01L 23/3121 |

FOREIGN PATENT DOCUMENTS

| CN | 110957269 A | 4/2020 |
| CN | 111883441 A | 11/2020 |
| DE | 102015103724 B4 | 9/2016 |
| DE | 102016217452 A1 | 10/2017 |
| DE | 102017123307 A1 | 4/2019 |
| DE | 102015103724 B4 | 3/2021 |

OTHER PUBLICATIONS

Search Report in Application No. 10 2021 118 202.6; German Patent and Trademark Office; pp. 1-7; Aug. 2, 2022; German Patent and Trademark Office, 80297, Munich, Germany.

* cited by examiner

*Primary Examiner* — Tremesha S Willis
(74) *Attorney, Agent, or Firm* — Robert A. Blaha; Smith Tempel Blaha LLC

(57) ABSTRACT

A component carrier includes a layer body with at least one electrically conductive layer structure and/or at least one electrically insulating layer structure, a component embedded in the layer body, and at least one galvanic connection stack at least partially on at least part of at least one main surface of the layer body. At least one of a bottom main surface and a top main surface of the embedded component is electrically connected to the at least one galvanic connection stack.

19 Claims, 10 Drawing Sheets

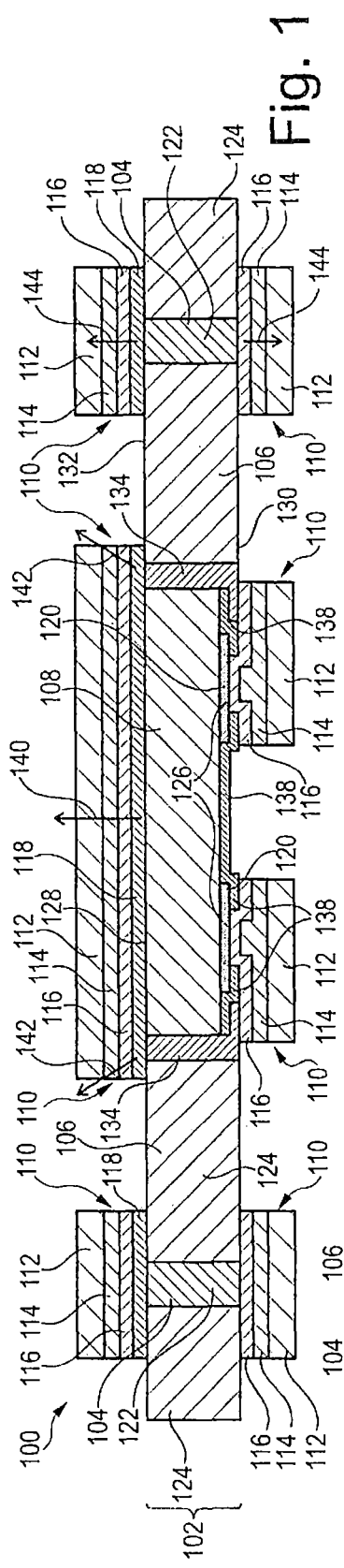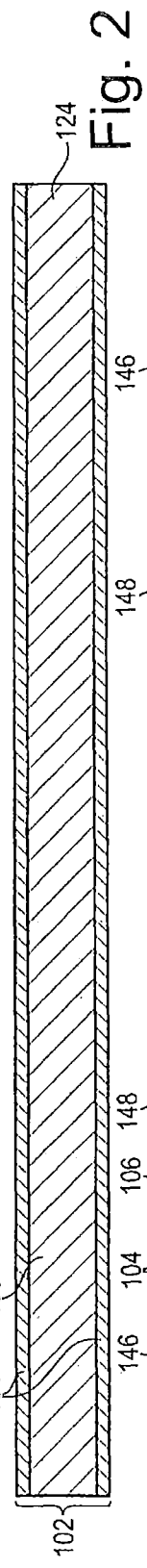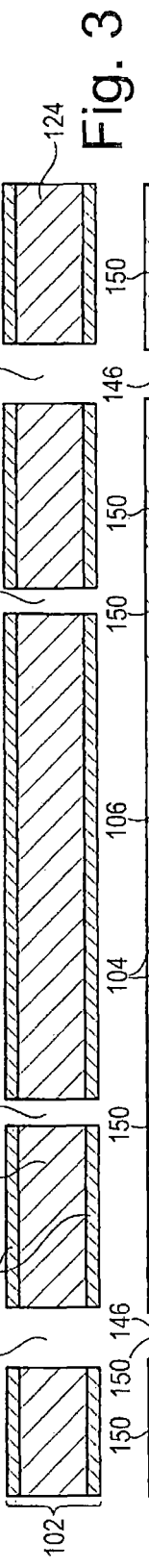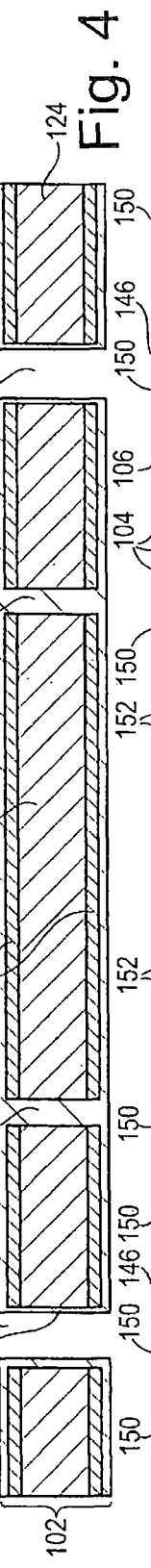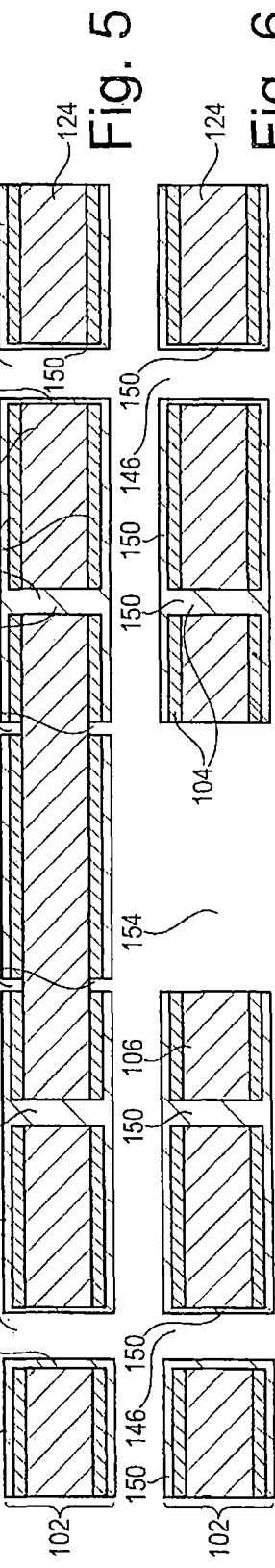

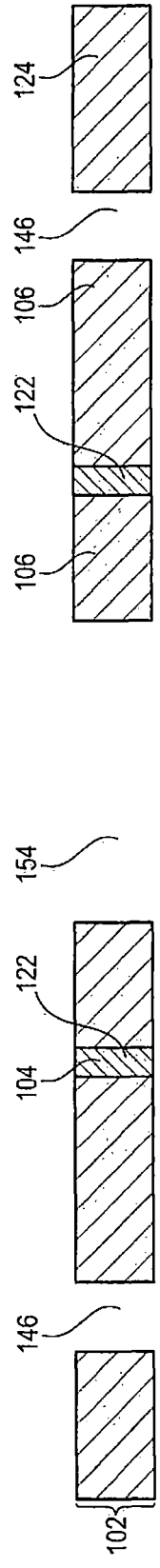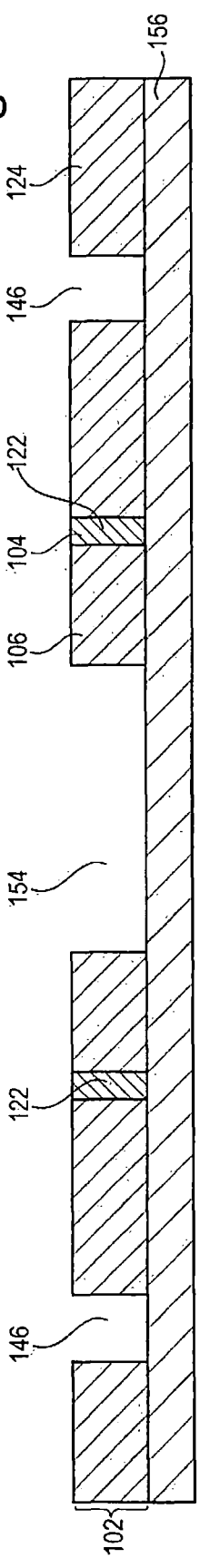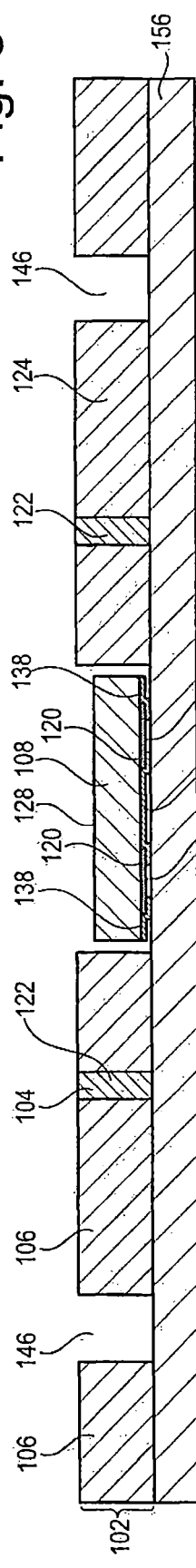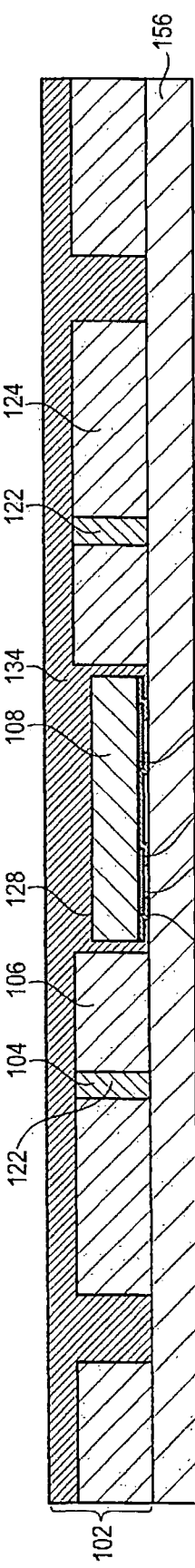

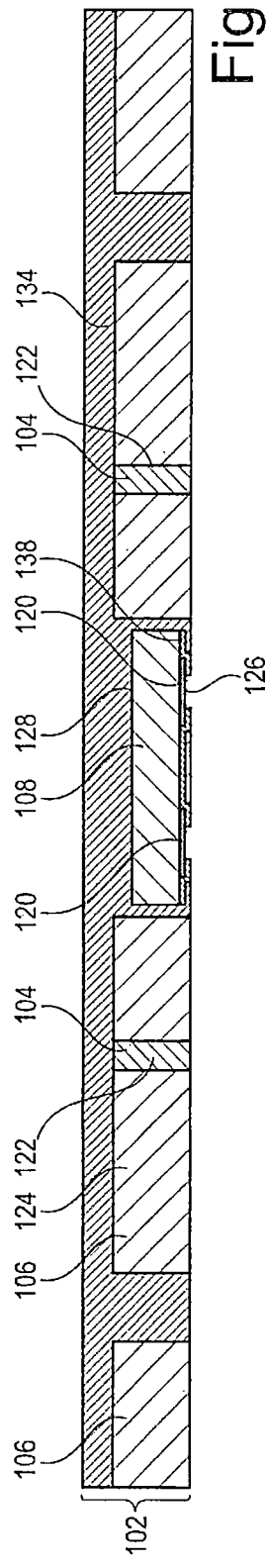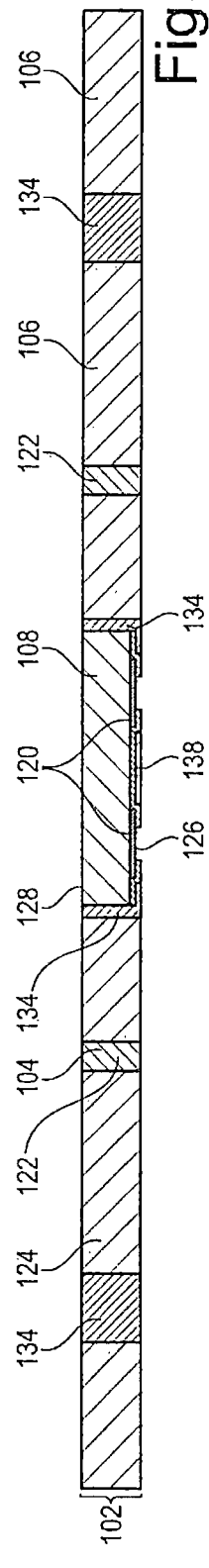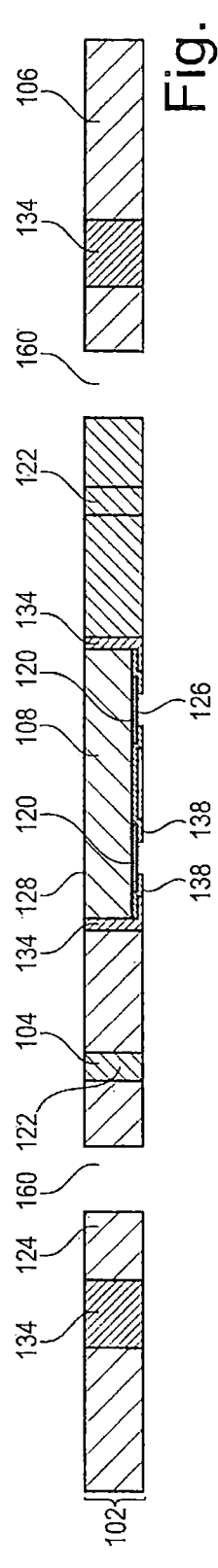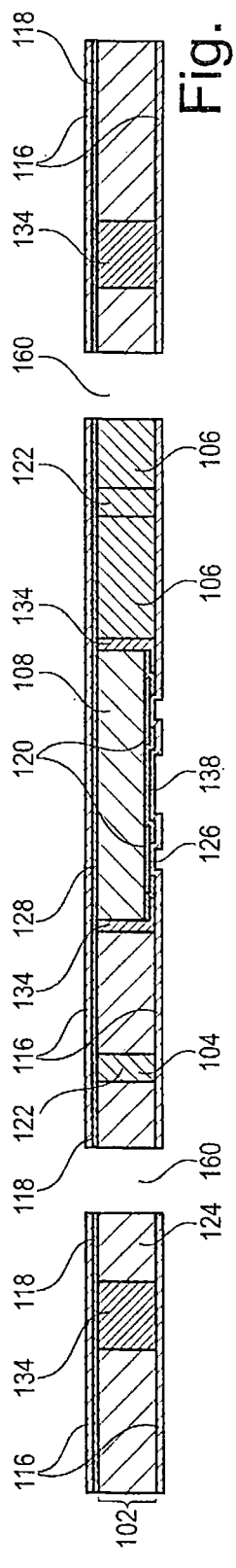

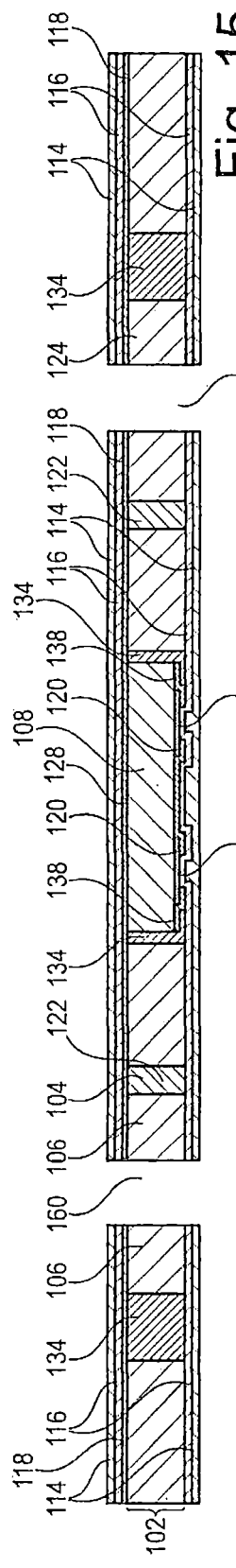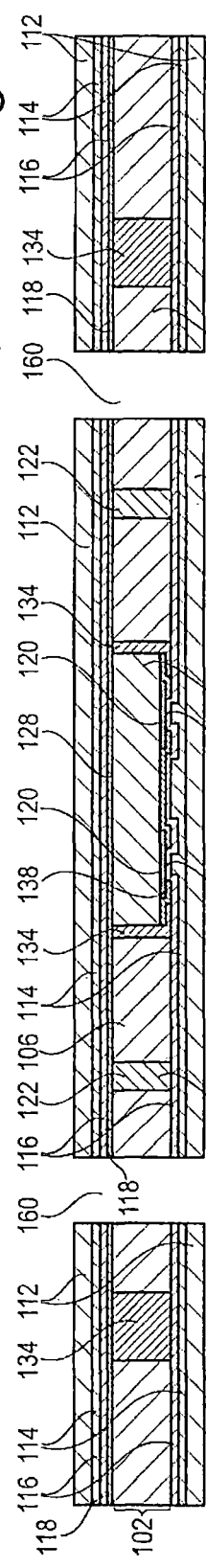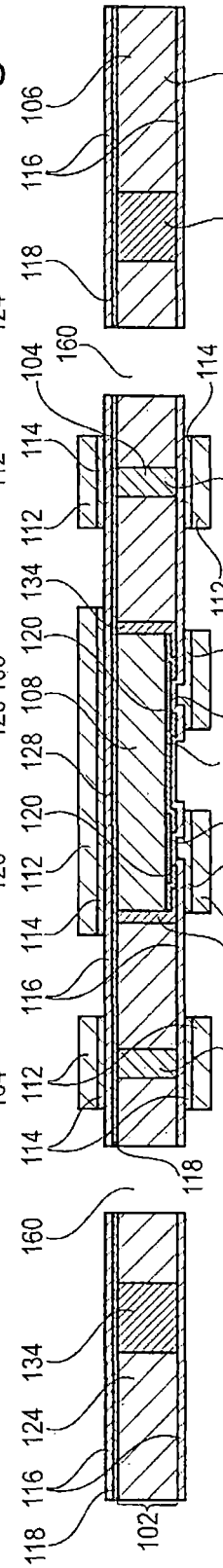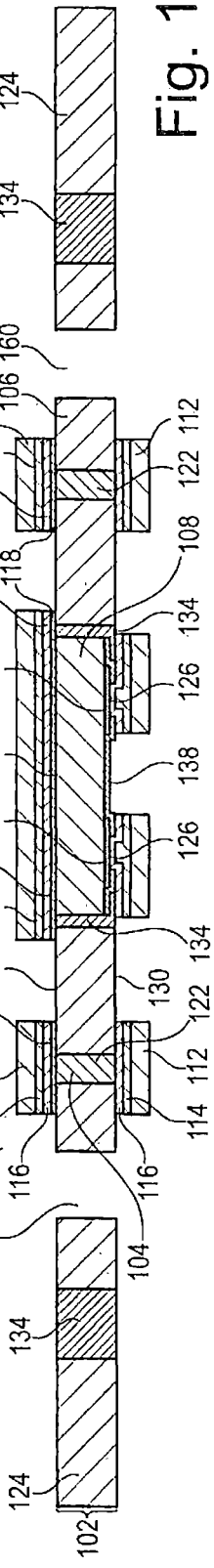

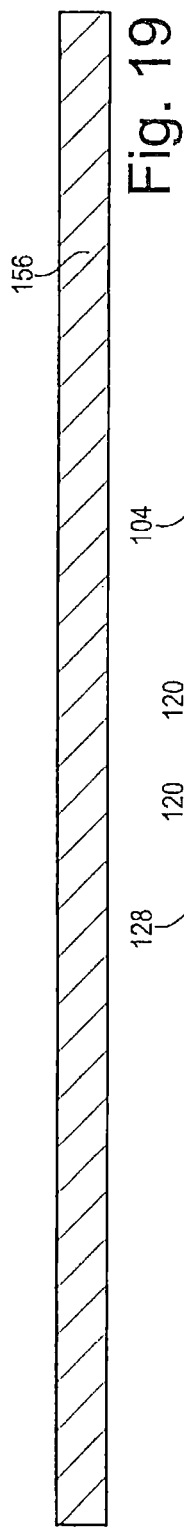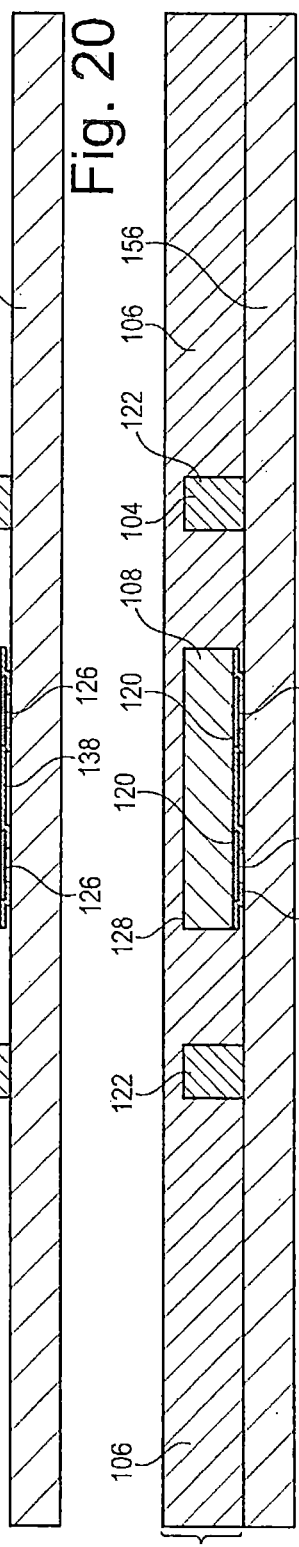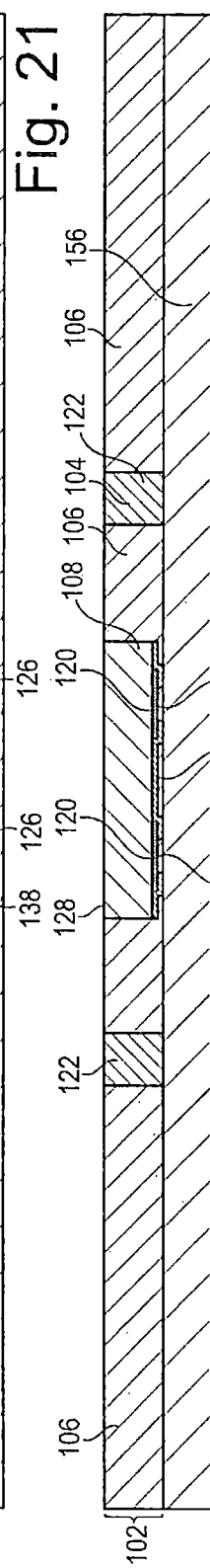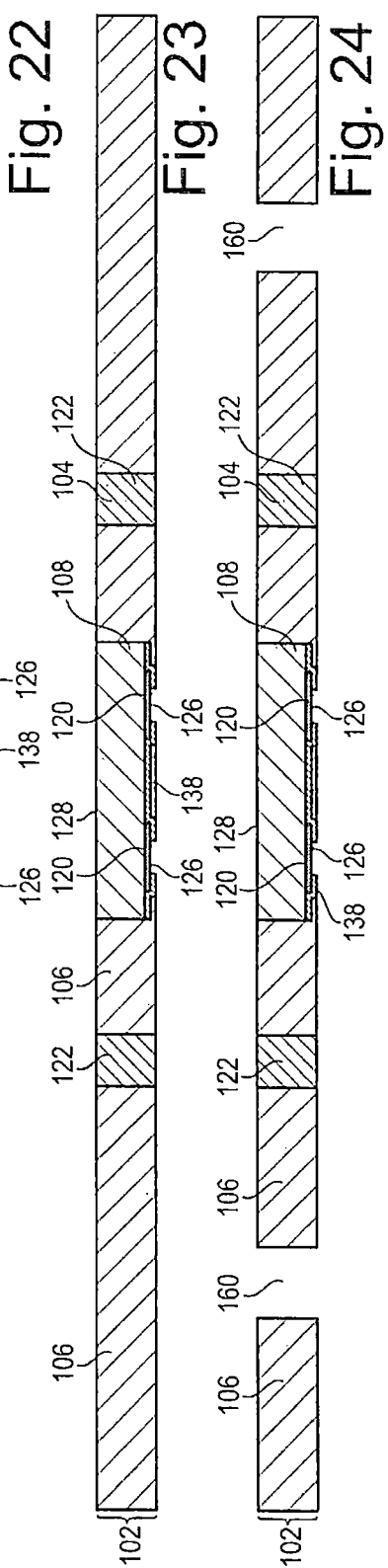

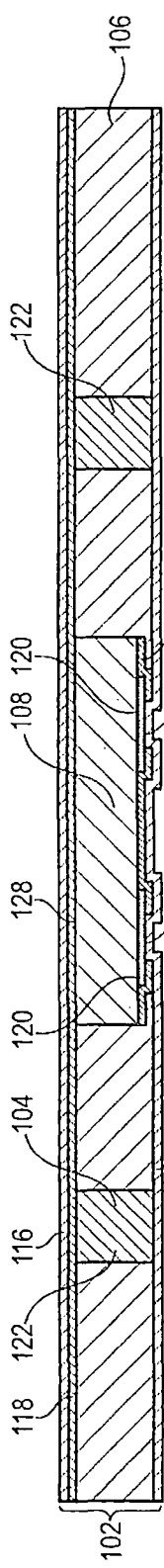
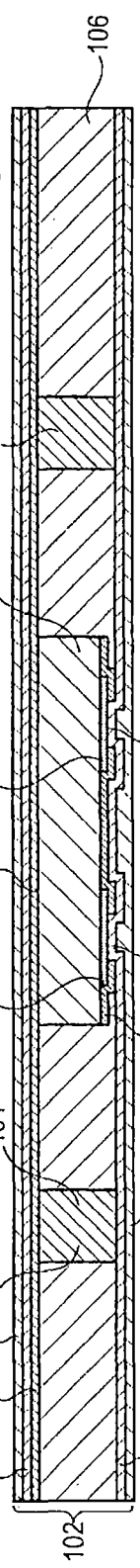
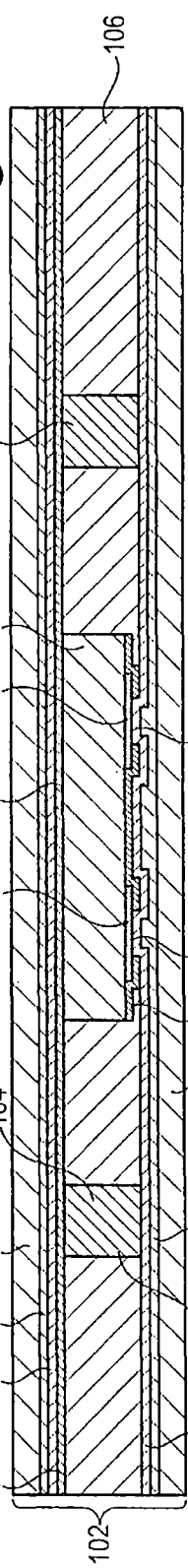
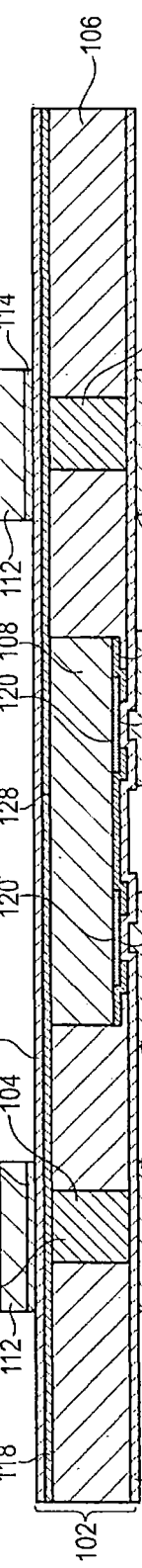
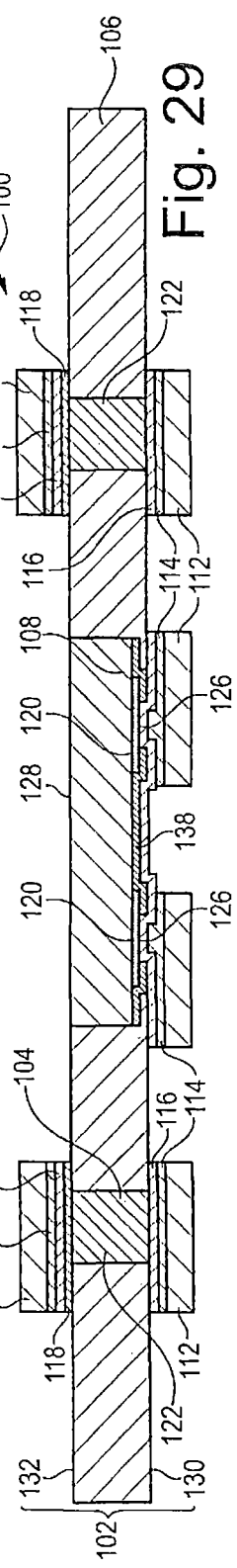

COMPONENT CARRIER WITH EMBEDDED COMPONENT CONNECTED BY GALVANIC CONNECTION STACK

CROSS-REFERENCE TO RELATED APPLICATIONS

This application claims the benefit of the filing date of European Patent Application No. 21171387.0, filed Apr. 29, 2021, and German Patent Application No. 102021118202.6, filed Jul. 14, 2021, the disclosures of which are hereby incorporated herein by reference.

TECHNICAL FIELD

Embodiments of the present invention relate to a component carrier, and a method of manufacturing a component carrier.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

For embedding a component in a layer stack, a through hole can be formed in the layer stack and can be closed from a bottom side by a temporary carrier such as an adhesive tape. A dielectric layer may be laminated on top of the stack and the component. Thereafter, the temporary carrier is released. Also, copper foils may be laminated and/or copper filled laser vias may be formed.

SUMMARY

Electrically connecting an embedded component is however still a challenge.

Thus, there may be a need for a component carrier with embedded component being manufacturable simply and with high reliability.

According to an exemplary embodiment of the invention, a component carrier is provided which comprises a layer body comprising at least one electrically conductive layer structure and/or at least one electrically insulating layer structure, a component embedded in the layer body, and at least one galvanic connection stack at least partially on at least part of at least one main surface of the layer body, wherein at least one of a bottom main surface and a top main surface of the embedded component is electrically connected to the at least one galvanic connection stack.

According to another exemplary embodiment of the invention, a method of manufacturing a component carrier is provided, wherein the method comprises providing a layer body comprising at least one electrically conductive layer structure and/or at least one electrically insulating layer structure, embedding a component in the layer body, and forming at least one galvanic connection stack at least partially on at least part of at least one main surface of the layer body and electrically connected to at least one of a bottom main surface and a top main surface of the embedded component.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer body, such as a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer body" may particularly denote a flat or planar sheet-like body. For instance, the layer body may be a layer stack, in particular a laminated layer stack or a laminate. Such a laminate may be formed by connecting a plurality of layer structures by the application of mechanical pressure and/or heat.

In the context of the present application, the term "layer structure" may particularly denote a continuous layer, a patterned layer or a plurality of non-consecutive islands within a common plane.

In the context of the present application, the term "component" may particularly denote an inlay, for instance fulfilling an electronic and/or a thermal task. For instance, the component may be an electronic component. Such an electronic component may be an active component such as a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In the context of the present application, the term "galvanic connection stack" may particularly denote a layered arrangement of multiple planar layer structures which are formed in parallel on top of one another and which are arranged for electrically connecting the embedded component, wherein the stack is at least partially formed by galvanic deposition, in particular electroplating. For galvanic deposition or electroplating of one or more layer structures of the galvanic connection stack, water-based solutions or electrolytes may be used which contain metal to be deposited as ions (for example as dissolved metal salts). An electric field between a first electrode (in particular an anode) and the preform of the component carrier to be manufactured as second electrode (in particular a cathode) may force (in particular positively charged) metal ions to move to the second electrode (in particular cathode) where they give up their charge and deposit them-selves as metallic material on the surface of the preform of the component carrier (more specifically on the surface of the layer body and/or of the embedded component), to thereby form a layer of the galvanic connection stack. Although one or more of the layer structures of the galvanic connection stack may be formed by galvanic deposition, at least one further layer structure of the galvanic connection stack may be formed by another process (for instance by sputtering or electroless deposition). For instance, a metallic seed layer which may function as an electrode of the preform of the component carrier to be coated by galvanic deposition, may be formed by sputtering or electroless deposition. The galvanic connection stack may be a sequence of a plurality of parallel layers, in particular at least two, more particularly at least three layers.

According to exemplary embodiments of the invention, a component carrier with embedded (in particular active electronic) component(s) is provided, wherein the component(s) may be electrically connected by a galvanic connection stack formed on a layer body (such as a laminated layer stack) of the component carrier, and preferably also directly on the embedded component(s). Such an at least partially electrically conductive galvanic connection stack may thus form an electric connection of an embedded component of the component carrier (such as a printed circuit board) in a highly accurate way (for instance using a simple lithographic process for defining lateral limits of the galvanic connection stack). Furthermore, forming at least part of the galvanic connection stack by galvanic deposition may also allow to form a galvanic connection stack simultaneously on both opposing main surfaces of the layer body of the component carrier, hence in a highly efficient way. Furthermore, galvanic deposition may allow to freely design a desired thickness of the galvanic connection stack over a broad range, which allows to freely adjust a desired electric conductivity and/or thermal conductivity of the galvanic connection stack. Thus, a precisely manufacturable component carrier with excellent electric, mechanical and thermal reliability and performance may be provided. By such a manufacturing architecture, also a powerful fan-out capability may be provided by the at least one galvanic connection stack. Processes such as laser via formation and/or copper foil lamination for electrically and/or thermally connecting an embedded electronic component may become dispensable or optional in exemplary embodiments.

In the following, further exemplary embodiments of the manufacturing method, and the component carrier will be explained.

In an embodiment, the at least one galvanic connection stack comprises a galvanically deposited main layer, for example made of copper. For instance, the galvanically deposited main layer may be formed by electroplating or galvanic plating. One or more plating stages may be carried out for adjusting the thickness of the galvanically deposited main layer, and in particular for optionally forming a plurality of sub-layers of the galvanically deposited main layer.

In an embodiment, the at least one galvanic connection stack comprises a seed layer. For example, the seed layer comprises at least one of a group consisting of a chemically deposited seed layer (in particular a palladium base layer and a copper layer grown thereon) or a physically deposited seed layer (in particular a sputtered seed layer). Such a seed layer may function as an electrode to which an electric current may be applied during forming the above mentioned galvanically deposited main layer. Such a seed layer may be formed for example by electroless deposition or sputter deposition (also denoted as sputtering). Electroless plating (which may also be denoted as chemical plating) may refer to a chemical process to create a metal coating, for instance by an autocatalytic chemical reduction of metal cations in a liquid bath. Sputtering may be denoted as a deposition process in which microscopic particles of a solid material are ejected from its surface, after the material is itself bombarded by energetic particles, for instance of a plasma or gas. In particular, the seed layer may be formed by a chemical or a physical deposition process.

In an embodiment, the seed layer is arranged beneath the galvanically deposited main layer. In other words, the seed layer may be used as electrically conductive base electrode for galvanically depositing the main layer thereon.

In an embodiment, the at least one galvanic connection stack comprises an adhesion promoting layer, for instance comprising titanium and/or chromate. The adhesion promoting layer may be made of material improving adhesion between the seed layer and the layer body. The provision of an adhesion promoting layer may suppress delamination of individual layer structures of the (in particular laminate-type) component carrier.

In an embodiment, the adhesion promoting layer is arranged beneath the seed layer. The presence of the adhesion promoting layer may keep this seed layer fixed to the rest of the component carrier.

In an embodiment, the at least one galvanic connection stack comprises a barrier layer. The barrier layer may be configured for inhibiting oxidation and/or material migration between material below and above the barrier layer. The provision of a barrier layer may be advantageous in particular on semiconductor material of the component and may prevent undesired phenomena such as surface oxidation of the semiconductor material, migration of material into and/or out of the semiconductor material, etc. Hence, the provision of a barrier layer may strengthen the mechanical and chemical integrity of the embedded component.

In an embodiment, the barrier layer is arranged beneath the adhesion promoting layer in particular between the component and the adhesion promoting layer. At the same time, the barrier layer may be arranged directly on the component for properly protecting it.

In an embodiment, the at least one galvanic connection stack has a rectangular cross-section. In particular, the galvanic connection stack may be laterally delimited on one or both opposing main surfaces of the layer body and/or component by substantially vertical sidewalls which may be defined for example by patterning a continuous galvanic connection stack layer sequence. For example, patterning may be accomplished by applying a patterned lithographic mask followed by etching. Consequently, the presence of the galvanic connection stack may be specifically limited to surface regions of the component carrier relating to a main surface of the embedded component to be cooled, a pad of the embedded component to be electrically contacted, and/or a surface portion of the layer body at which a laterally confined section of the galvanic connection stack contacts an electrically conductive vertical through connection extending through dielectric material of the layer body. Such a lithographic definition of lateral limits of the galvanic connection stack may allow to spatially define its function in a precise and simple way.

The bottom main surface of the component and the bottom main surface of the layer body may be coplanar, i.e., may lie in a common plane. Additionally or alternatively, the top main surface of the component and the top main surface of the layer body may be coplanar, i.e., may lie in a common plane. This promotes the compact design of the component carrier.

Apart from the vertical through connections, the layer body in which the component is embedded may be purely dielectric. The only needed electrically conductive connection structures of such an embodiment are the vertical through connections, and the galvanic connection stacks above and below the layer body.

In an embodiment, the at least one galvanic connection stack comprises a mirror symmetric layer sequence on both opposing main surfaces of the layer body, which may be found simultaneously. For instance, the outermost layer of each galvanic connection stack may be a galvanically deposited main layer, followed by a seed layer and an adhesion promoting layer. Such a mirror symmetric layer sequence of both opposing main surfaces may allow to manufacture the galvanic connection stacks on the opposing main surfaces by simultaneous layer formation processes, and hence in a highly efficient way. However, a barrier layer may be only needed on one of the opposing main surfaces of the component carrier, i.e., where exposed semiconductor material of the embedded component is present. On a main surface of a semiconductor component comprising pads, a protection layer (for instance made of polyimide) may be present which renders a barrier layer dispensable on this side.

In an embodiment, the at least one galvanic connection stack is laterally confined, on a main surface of the component, within a region in which at least one pad of the component is arranged. If more than one pad is present on one main surface of the component, a plurality of laterally confined and thereby electrically separated sections of a galvanic connection stack may be defined. Such a lateral confinement of a respective section of the galvanic connection stack may allow to spatially define the assigned function thereof.

In an embodiment, the main surface of the component at which the at least one pad of the component is arranged is a bottom main surface. Hence, the embedded component may be arranged face-down. This has the advantage that no additional processes of exposing the pad(s) on the bottom side are necessary, for instance when the component carrier is manufactured using a temporary carrier attached to the bottom side of the component. Alternatively, the embedded component may be arranged face-up, i.e., with one or more pads on an upper main surface of the component. In yet another embodiment, the embedded component may have pads on each of the two opposing main surfaces thereof. In such a scenario, a respective laterally confined section of the galvanic connection stack may be present on each of the two opposing main surfaces of the component for contacting all pads. In the latter mentioned scenario, it is also for instance possible that the one or more pads on the bottom side are contacted by at least one laterally confined section of the galvanic connection stack, whereas one or more pads on the topside can be contacted by metal filled vias (in particular copper-filled laser vias).

In an embodiment, the at least one galvanic connection stack covers an entire main surface of the component at which no pad of the component is arranged. Highly advantageously, an electrically inactive main surface of the component may be fully covered by a galvanic connection stack, for instance over the entire main surface of the component. In such embodiments, said galvanic connection stack may function for removing heat from the embedded component, i.e., for cooling. The galvanic connection stack may also be configured for heat spreading, for example over a 45° angular range in each direction. Thus, galvanic connection stacks may fulfill a double function, i.e., electrically connecting pads of the embedded component on one side and removing heat created by the component during operation of the component carrier on the opposing side. Consequently, thermal stress may be suppressed by properly removing heat from the embedded component by a full-surface heat removal galvanic connection stack.

In an embodiment, the at least one galvanic connection stack covering an electronically inactive main surface (i.e., without pads) of the component protrudes laterally beyond this main surface of the component. In such a scenario, the heat removal capability of the galvanic connection stack arranged directly on an electrically inactive main surface of the embedded component may be further suppressed by increasing the heat removing material of the galvanic connection stack. Furthermore, laterally extending the galvanic connection stack beyond lateral limits of the embedded component may also allow an improved heat distribution over the component carrier, and in particular also a sideways heat spreading away from the embedded component.

In an embodiment, the at least one electrically conductive layer structure comprises at least one vertical through connection extending vertically through the entire layer body, i.e., extending completely between the opposing main surfaces of the layer body. In particular, the at least one vertical through connection may be electrically connected to at least one of the at least one galvanic connection stack, in particular at both opposing main surfaces of the layer body. For instance, one or more through holes may be formed in the layer body, which may for instance be a dielectric core. Through hole formation may be accomplished for example by mechanically drilling or laser drilling. The through hole may then be filled by an electrically conductive material, such as copper, for example by plating. Alternatively, the metallic vertical through connection can also be a metallic pillar, for instance a copper pillar. Highly advantageously, the electrically conductive vertical through connection extending through the layer body may be contacted on one or both opposing main surfaces of the layer body by a galvanic connection stack. This may allow to establish an electrically conductive connection structure having a substantial I-shape in a cross-sectional view.

In an embodiment, at least one of the at least one galvanic connection stack provides a heat spreading structure, in particular a 45° heat spreading structure. More specifically, a galvanic connection stack may be arranged on one main surface of the embedded component so that heat created by the component is removed by the galvanic connection stack over a spatial range corresponding to a thermal flow occurring within a conical or frustoconical region with an opening angle of ±45°, or more.

In an embodiment, the layer body comprises a core comprising fully cured dielectric material. In the context of the present application, the term "core" may particularly denote a rigid plate structure for a component carrier comprising a preferably fully cured dielectric body (such as a central plate) which may be optionally covered on one or both opposing main surfaces thereof with a respective electrically conductive layer structure such as a patterned metal layer. For instance, the dielectric body may comprise resin (for instance epoxy resin) and reinforcing particles (for instance glass fibers or glass spheres), and may for instance be FR4. Optionally, two opposing main surfaces of a core may be electrically coupled with each other by a vertical through connection such as a copper plated laser via or a mechanically drilled and copper plated via. More specifically, a core of a component carrier such as a printed circuit board (PCB) may be a rigid base material being optionally laminated with copper on one or two sides. Such a core may be used for manufacturing single-sided and double-sided boards, but may also be used in the production of multi-layer component carriers (in particular PCBs).

The component may be embedded in the core (see embodiment of FIG. 2 to FIG. 18). In an alternative embodiment, the component may be embedded in a coreless component carrier (see embodiment of FIG. 19 to FIG. 29).

In an embodiment, at least part of the component is directly surrounded by at least one of the at least one electrically insulating layer structure being functionalized as buffer structure for buffering stress. Preferably, the buffer structure comprises or consists of a material which has a value of the Young modulus below 8 GPa, in particular below 3 GPa, more particularly below 1 GPa. Such a material may serve as a mechanical buffer structure, i.e., as a mechanically relatively flexible or elastic electrically insulating structure. This may render said material highly appropriate for (in particular directly) surrounding an embedded component of the component carrier. Such a mechanical buffer structure may have a locally reduced value of the Young modulus and may therefore function as a mechanically damping or force balancing structure, for instance in the event of thermal stress. Thus, excellent results may be achieved when embedding the components in a low Young modulus dielectric. The dielectric buffer structure may have a lower value of the Young modulus than any other dielectric material of the at least one electrically insulating layer structure of the component carrier.

In an embodiment, the at least one galvanic connection stack has a stiffness gradient with a stiffness which decreases from the laminated layer body towards an exterior side of the component carrier. For instance, a barrier layer and/or an adhesion promoting layer being arranged directly on or close to the layer body may be stiffer than the exterior located galvanically deposited main layer, the latter being softer and/or having plastically deformable properties. A corresponding spatial stiffness gradient in a vertical direction of the component carrier has turned out to increase the mechanical integrity of the component carrier as a whole, and to suppress artefacts such as delamination and warpage.

In an embodiment, at least one of the bottom main surface and the top main surface of the embedded component is in direct physical contact with the at least one galvanic connection stack. Thus, a direct mechanical contact between embedded component and galvanic connection stack may be formed.

In an embodiment, the layer body is a laminate, i.e., a layer sequence being interconnected by the application of mechanical pressure and/or heat.

In an embodiment, the component comprises at least one pad constituted by at least part of at least one of the at least one galvanic connection stack. Hence, it may be possible to embed a padless component in the layer body and form its pad(s) by applying the galvanic connections on the padless component, in particular after embedding of the component in the layer body.

In an embodiment, at least one of the at least one galvanic connection stack arranged on at least one pad at a main surface of the component forms a redistribution structure. Such a redistribution structure may redistribute an electric connection wiring in a plane directly below the embedded component and may thereby provide traces, leads and/or other circuitry distributing electric signals and/or electric power within said plane. For instance, the redistribution structure may comprise a fan-out structure and/or a fan-in structure. A redistribution structure or layer may be configured as planar (or at least substantially planar) patterned galvanic connection stack.

In an embodiment, at least one of the at least one galvanic connection stack extends on and laterally beyond a main surface of the component and has a portion, for example a lateral end portion (such as the portion extending laterally beyond the component), comprising a wavy structure. In particular, such a wavy portion of the galvanic connection stack protruding laterally beyond the sidewalls of the component may be formed with at least one indentation having the shape of a wave. It has turned out that the wavy structure may protect electric traces of the component carrier from scratches and mechanical damage and may cushion tension triggered by a CTE (coefficient of thermal expansion) mismatch of materials of the component carrier.

However, it should be mentioned that the wavy structure does not necessarily have to be a lateral end portion ending close to the component but can connect any other pad further away from the component as well. Thus, it is possible that the trace proceeds further across the cavity side-walls. More generally, the portion of the galvanic connection stack comprising the wavy structure may extend beyond a main surface of the component and may be electrically connected to another electrically conductive element, such as a pad, facing away from the component. In other words, the wavy portion may extend laterally between the component and said electrically conductive element.

In an embodiment, a vertical wave amplitude of the wavy structure is in a range from 1 µm to 20 µm, in particular in a range from 2 µm to 10 µm. In particular, an indentation of the wavy structure with the mentioned dimensions may properly buffer stress.

In an embodiment, the component carrier comprises a dielectric bracket engaging a sidewall and connected portions of the bottom main surface and the top main surface of the embedded component. For instance, said dielectric bracket may be substantially C-shaped in a cross-section. Advantageously, anchoring, clipping or clamping the embedded component laterally by a dielectric bracket may improve stability and may contribute to surface leveling.

In an embodiment, the dielectric bracket engages the sidewall and the connected portions along an entire perimeter of the component. Hence, the bracket may be an annular structure anchoring, clamping or clipping the component fully circumferentially. Excellent stability may then be achieved.

In an embodiment, at least part of the dielectric bracket is a buffer structure for buffering stress, wherein the buffer structure in particular comprises or consists of a material which has a value of the Young modulus below 8 GPa, in particular below 3 GPa, more particularly below 1 GPa. Such a material may serve as a flexible or elastic buffer structure functioning as a mechanically damping or force balancing structure, for instance in the event of thermal stress.

In an embodiment, a portion of the bottom main surface of the embedded component being covered by one of the at least one galvanic connection stack is at least 60%. In other words, a partial area of the bottom main surface of the component being covered by a galvanic connection stack divided by an entire area of the bottom main surface of the component may be at least 60%. Additionally or alternatively, a portion of the top main surface of the embedded component being covered by one of the at least one galvanic connection stack is at least 90%, in particular 100%. In other words, a major portion or even the entire area of the top main surface of the component may be covered by a galvanic connection stack. An achievable high copper coverage may ensure a reliable electric connection of the component and may efficiently contribute to heat removal. Furthermore, such a high copper coverage may contribute to an efficient shielding of electromagnetic radiation inside the component carrier.

The roughness of a surface may be defined as and may be measured as the centerline average height Ra. Ra is the arithmetic mean value of all distances of the profile from the centerline. The roughness of a surface may however also be defined as and may be measured as average roughness depth Rz. Rz can be determined when a reference length is sampled from a roughness curve in a direction of a mean line, and may denote the distance between the top profile peak line and the bottom profile valley line on this sampled portion as measured in the longitudinal direction of the roughness curve (for instance, Rz may be determined by averaging over five individual measuring paths). For instance, the measurement or determination of roughness Ra and Rz may be carried out according to DIN EN ISO 4287:2010.

In an embodiment, a roughness Ra of the top main surface of the embedded component (for instance of its silicon surface when the component is embodied as silicon chip) is in a range from 20 nm to 130 nm and/or a roughness Rz of the top main surface of the embedded component is in a range from 200 nm to 1500 nm. Additionally or alternatively, a roughness Ra of at least one pad at a main surface of the component is in a range from 20 nm to 130 nm and/or a roughness Rz of at least one pad at a main surface of the component is in a range from 500 nm to 1500 nm. Additionally or alternatively, a roughness Ra of an electrically insulating protection layer (in particular an electrically insulating protection ring surrounding a pad) at a main surface of the component is in a range from 10 nm to 40 nm and/or a roughness Rz of an electrically insulating protection layer at a main surface of the component is in a range from 50 nm to 250 nm. Advantageously, the mentioned roughness values may ensure a homogeneous deposition of applied (in particular sputtered) adhesion promoters and/or seed layers. This may reliably prevent undesired phenomena such as delamination and warpage.

In an embodiment, the component comprises at least one circumferentially closed electrically insulating protection layer (in particular an electrically insulating protection ring surrounding a pad), for example having a stepped configuration, surrounding at least one pad at a main surface of the component. For example, such an electrically insulating protection layer may form part of the component and may surround a respective metallic pad thereon. Preferably, such an electrically insulating protection layer may be made of polyimide. In particular when formed with a stepped annular configuration around a pad of the component, the electrically insulating protection layer may function as a foot or bottom-sided protrusion anchoring the embedded component in surrounding stack material.

In an embodiment, the component comprises at least one electrically insulating protection layer at a main surface of the component and forming at least one protruding anchoring foot. Such an anchoring foot, which may in particular protrude downwardly, may anchor the embedded component in surrounding material of the component carrier for suppressing delamination.

In an embodiment, the component comprises at least one pad connected to at least one of the at least one galvanic connection stack and having a shape of a group consisting of a circular shape and a non-circular shape, in particular a rectangular shape. What concerns the configuration of the pads, they can be formed with any shape, such as square-shaped pads. Advantageously, such pads can be connected on the same level with the described method using sputtering.

In an embodiment, the component comprises a plurality of pads connected to at least one of the at least one galvanic connection stack, wherein at least two of the pads are electrically connected with each other by a section of said at least one galvanic connection stack. Advantageously, it is possible to combine several pads by metallizing several pads together (see FIG. 30, reference sign 120', where four pads are covered with a metal film applied thereon and connected accordingly, or FIG. 36).

In an embodiment, embedding the component comprises temporarily attaching the component on a temporary carrier, and removing the temporary carrier before completing manufacture of the component carrier. For instance, such a temporary carrier may be a sticky tape or sheet which may be removed after having embedded an assembled component in a through hole of a stack or core. The temporary carrier temporarily defines a position of the component within the component carrier being manufactured and provides temporary stability until permanent stability is achieved by lamination. The temporary carrier may then be detached from the component carrier or a preform thereof.

In an embodiment, a polar part of the surface energy of an attaching surface of the temporary carrier is smaller than 10 mN/m, in particular smaller than or equal to 5 mN/m. The polar part is the part of the surface free energy of surface material of the temporary carrier which is due to polar interactions. In an embodiment, a disperse part of the surface energy of an attaching surface of the temporary carrier is in a range from 15 mN/m to 30 mN/m, in particular in a range from 20 mN/m to 25 mN/m. The disperse (or dispersive) part is the part of the surface free energy of surface material of the temporary carrier which is due to dispersive interactions. In an embodiment, an overall surface energy (i.e., in particular the sum of the polar part and the disperse part of the surface energy) of an attaching surface of the temporary carrier is in a range from 15 mN/m to 40 mN/m, in particular in a range from 21 mN/m to 26 mN/m. The mentioned material selection may promote adhesion between the assembled component and the temporary carrier to avoid slipping and displacement of the component during processing.

In an embodiment, a flexural strength of material of the temporary carrier is in a range from 0.1 MPa to 5 MPa, in particular in a range from 0.4 MPa to 1.2 MPa. In the context of the present application, the term "flexural strength" (which may also be denoted as modulus of rupture, bend strength, or transverse rupture strength) may denote a material property defining the stress in a material just before it yields in a flexure test. A transverse bending test may be employed for determining the flexural strength, in which a specimen having a circular or rectangular cross-section is bent until fracture or yielding using a three-point flexural test technique. A material selection for achieving the above-mentioned values of the flexural strength may avoid wrinkles on the temporary carrier and tilting of the assembled component.

In the following, different embedding technologies which may be used according to exemplary embodiments for embedding the component in the layer body will be explained:

In an embodiment, the method of manufacturing the component carrier comprises embedding the component in an opening of the layer body (in particular layer stack), wherein the opening is at least temporarily closed at a bottom side by a sticky layer during the embedding (see embodiment of FIG. 2 to FIG. 18). In the context of the present application, the term "sticky layer" may particularly denote a tape, film, foil, sheet or plate having an adhesive surface. In use, the sticky layer may be used to be adhered to a main surface of a layer body for closing an opening extending through the layer body. The component to the embedded may be adhered to the sticky layer for defining a position of the component in the opening and thus relative to the layer body. When the sticky layer is removed from the layer body before completing manufacture of the component carrier, the sticky layer may be denoted as a temporary carrier. In other embodiments, the sticky layer may however form part of the readily manufactured component carrier. By adhering the component on the sticky tape during the embedding process, the spatial accuracy of the embedding of the component may be significantly improved.

In another embodiment, the method comprises mounting the component on at least one of the layer structures or on a temporary carrier, and thereafter covering the component with layer structures or with further ones of the layer structures, wherein at least one of said layer structures is provided with an opening accommodating the component. For example, the opening of the respective layer structure may be cut as a through hole into the respective layer structure. Further alternatively, it is also possible to cover the component, attached to a temporary carrier or to one or more layer structures, with a flowable medium, such as resin. Concerning these embodiments, reference is also made to the embodiment of FIG. 19 to FIG. 29.

In yet another embodiment, the method comprises embedding a release layer in the layer body, thereafter forming an opening in the layer body by removing a piece of the layer body which is delimited at a bottom side by the release layer, and thereafter accommodating the component in the opening. For instance, such a release layer may be made of a material showing poorly adhesive properties with respect to surrounding layer body material. For instance, an appropriate material for the release layer is polytetrafluoroethylene (PTFE), or a waxy compound. The method may comprise forming a circumferential cutting trench in the layer body extending up to the release layer to thereby separate the piece from a rest of the layer body. Cutting said trench may be accomplished for example by laser drilling or mechanically drilling.

In another embodiment, the method comprises forming an opening in the layer body by routing (preferably depth routing), and thereafter accommodating the component on a bottom surface of the routed layer body in the opening. Routing is an appropriate and simple mechanism of precisely defining a blind hole-type opening for subsequently accommodating the component.

In an embodiment, the layer body is a layer stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Rein-forcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one further component may be embedded in and/or surface mounted on the stack. The component and/or the at least one further component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semi-conductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 1 illustrates a cross-sectional view of a component carrier according to an exemplary embodiment of the invention.

FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17 to FIG. 18 illustrate cross-sectional views of structures obtained during carrying out a method of manufacturing a component carrier, shown in FIG. 18, according to an exemplary embodiment of the invention.

FIG. 19, FIG. 20, FIG. 21, FIG. 22, FIG. 23, FIG. 24, FIG. 25, FIG. 26, FIG. 27, FIG. 28 to FIG. 29 illustrate cross-sectional views of structures obtained during carrying out a method of manufacturing a component carrier, shown in FIG. 29, according to another exemplary embodiment of the invention.

DETAILED DESCRIPTION OF ILLUSTRATED EMBODIMENTS

Figure 30:
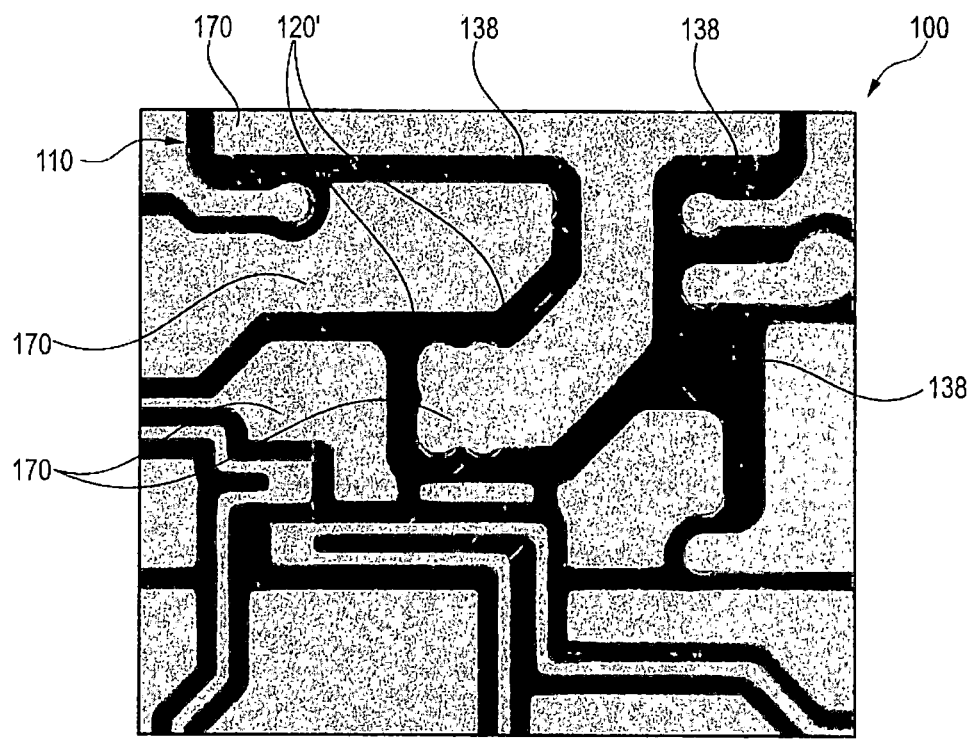
FIG. 30 illustrates a bottom view of part of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

Conventionally, embedded component packages are manufactured with a single-sided component connection. This may limit the overall functionality of a manufactured component carrier and especially its usage for power packages. For power applications, conventional component carriers may be limited in terms of thermal performance and ampacity, and/or may suffer from accuracy and material restrictions.

According to an exemplary embodiment of the invention, a component carrier is provided in which a component (in particular a semiconductor chip, for example a power semiconductor chip) embedded in a layer body (in particular a laminated layer stack) is connected to a galvanic connection stack on one or both opposing main surfaces.

For instance, such a galvanic connection stack may provide a fan-out function on one main surface, for instance on a bottom side. In order to accomplish this, it may be possible to form the galvanic connection stack selectively on one or more pads of a semiconductor-chip type component, in particular on the mentioned bottom side. On a top side of the embedded component, the galvanic connection stack may for instance provide a heat removal function. For this purpose, it is possible to thermally contact the entire main surface of the embedded component with a heat removing galvanic connection stack. Alternatively, components with pads on both opposing main surfaces may be provided, wherein the pads may be electrically connected by galvanic connection stacks formed on each of the opposing main surfaces. In yet another embodiment, it may be possible to form one or more pads on one or both opposing main surfaces of the component as galvanic connection stack, so that the galvanic connection stack may be embodied as a galvanic connection pad. All these embodiments may also be combined.

For example, the galvanic connection stack(s) may comprise a sputtered or chemically formed seed layer (for instance comprising titanium and/or copper) on which a galvanically deposited main layer may be formed (for instance a galvanic copper layer formed by galvanic processing). Furthermore, it is possible to provide the galvanic connection stack with a barrier layer (for instance made of titanium nitride) for separating the component (in particular a semiconductor surface material thereof) from the seed layer.

The manufacturing architecture of exemplary embodiments of the invention may allow to connect one or both opposing main surfaces of the embedded (in particular active electronic) component with the galvanic connection stack. This may allow to establish electric and/or thermal connections of the embedded component with high accuracy and for promoting proper electrical and also thermal performance and reliability. It is particularly beneficial that the connection of a component using a seed and galvanic layer sequence in form of the galvanic connection stack offers a high degree of freedom of selecting pad materials of the component. Such a manufacturing architecture may be applied advantageously as any-layer concept for manufacturing component carriers, such as printed circuit boards (PCBs).

Advantageously, it may also be possible to form an electrically conductive vertical through connection extending through the layer body (in particular a fully cured core) for redistributing a signal path from a bottom side to top side of the electronic component. Further advantageously, such a vertical through connection may be electrically coupled on one or both opposing main surfaces of the layer body by the above-mentioned one or more galvanic connection stacks.

According to an exemplary embodiment of the invention, a high-accuracy galvanic lithographic component connection on a front-side may be combined with a full-surface back-side component connection for excellent heat transfer and high current component sourcing. This mixed usage of different connection technologies gives the opportunity for embedding nearly any type of component and contributes to the provision of a simple and accurate embedding process. In particular, a fan-out architecture may be implemented for components with high input/output count and/or a high input/output density. Furthermore, a low package resistance may be realized, and an excellent heat transfer may render the component carrier appropriate for use in power applications. Highly advantageously, a combination of accurate fan-out concepts and full surface component connection in one embedded package in form of a PCB-type component carrier may be made possible.

Exemplary embodiments of the invention have multiple advantages. Firstly, there is substantially no component design limitation in terms of in-put/output count density. Moreover, exemplary embodiments of the invention offer the possibility for component pad enlargement by a galvanic lithographic process to increase the registration tolerance for high-density integration (HDI) connection for next layers. Furthermore, exemplary embodiments make it possible to provide an active heat transfer management by providing a galvanic component back-side connection. Beyond this, exemplary embodiments may enable a footprint reduction of components due to a higher possible input/output density. Exemplary embodiments of the invention are particularly well-suited for high-frequency (HF) applications, because of the usage of PVD (physical vapor deposition) sputtering technology or other layer deposition technologies, rather than using rough base copper foils. This may reduce losses at high frequencies in view of the skin effect. Furthermore, component carriers manufactured according to exemplary embodiments of the invention may have a significantly reduced thickness and may therefore be manufactured with high compactness and with low effort. Furthermore, exemplary embodiments enable a direct fan-out architecture with proper heat transfer.

Advantageously, exemplary embodiments of the invention may provide a component carrier combining a high-density fan-out concept with full surface component connections in one embedded package.

In an embodiment, an interface between a prepreg and component copper may be avoided, so that delamination may be suppressed. Furthermore, laser processes for electrically connecting a component in a laminated component carrier may be dispensable, so that no thermal damage of component passivation layers may occur. Moreover, exemplary embodiments of the invention offer the possibility to create component pad enlargement by photo structuring processes (for instance when carrying out a subtractive or semi-additive manufacturing process) to increase registration tolerances for HDI connections on subsequent layers. Apart from this, an excellent heat transfer may be guaranteed by creating a PVD and galvanic full surface component connection. Exemplary embodiments are particularly well suited for HF applications because of the implementation of (in particular PVD) sputtering technology, instead of using rough copper foils being prone to significant high-frequency signal losses. Furthermore, a component carrier with embedded component(s) being highly compact in particular in vertical direction may be obtained. Thus, exemplary embodiments are particularly compatible with high-power applications, high-frequency applications, fan-out applications, and sensor applications.

Exemplary embodiments of the invention enable the implementation of a high accuracy galvanic lithographic back-side component connection combined with a full surface front-side component connection. The manufacturing architecture according to exemplary embodiments of the invention gives the opportunity to embed nearly any type of active component and allows the production of component carriers with a simple embedding process.

Exemplary embodiments allow the manufacture of component carriers with embedded components and galvanic connection stacks with low effort, in particular without copper foils, without laser processing, and optionally without prepreg sheets.

For example, components with 180 aluminum terminated input/output terminals and a pad size of 95 µm have been embedded. Using PVD sputtering technology and a mechanical planarization process, it has been possible to realize a 40 µm line/space fan-out layer on both FR4 and polyimide surfaces.

FIG. 1 illustrates a cross-sectional view of a component carrier 100 according to an exemplary embodiment of the invention.

Component carrier 100 according to FIG. 1 may be configured as a substantially plate-shaped printed circuit board (PCB). Thus, the component carrier 100 shown in FIG. 1 may be highly compact in a vertical direction. More specifically, the component carrier 100 may comprise a layer body 102 comprising one or more electrically conductive layer structures 104 and/or one or more electrically insulating layer structures 106. Each of the electrically conductive layer structures 104 may comprise a multi-layer section (see reference signs 110) and vertical through connections, for example copper filled vias which may be created by drilling and plating. The electrically insulating layer structure(s) 106 may comprise a respective resin (such as a respective epoxy resin), preferably comprising reinforcing particles therein (for instance glass fibers or glass spheres). For instance, the electrically insulating layer structures 106 may be made of FR4.

In the illustrated embodiment, the layer body 102 comprises a core 124 of fully cured FR4 material and vertical through connections 122 made of copper and extending vertically through the core 124.

Furthermore, the component carrier 100 comprises a component 108 which is embedded in the layer body 102. For example, component 108 may be an active electronic component, such as a semiconductor chip (for example a silicon chip). For example, component 108 may be configured for a power application and/or a high-frequency application. In the shown embodiment, component 108 has two metallic pads 120 on a lower main surface. An electrically insulating protection layer 138, for instance made of a plastic such as polyimide, is formed on the lower main surface of the component 108 but keeps at least part of the pads 120 exposed for enabling their electric connection. The protection layer 138 protects semiconductor material of the component 108 from undesired phenomena such as oxidation or material migration. No pads 120 and no protection layer 138 are foreseen at the upper main surface 128 of the component 108 in the illustrated embodiment, so that the upper main surface 128 of the component 108 may be delimited by semiconductor material, such as silicon. Thus, the component 108 may be provided in a face-down configuration.

A respective multi-layer galvanic connection stack 110 with different laterally confined sections (in the shown embodiment three on the top side and four on the bottom side) is formed on defined surface portions of each of the opposing main surfaces 130, 132 of the layer body 102 and on defined surface portions of each of the opposing main surfaces 126, 128 of the component 108, respectively.

More specifically, two laterally confined sections of one of the galvanic connection stacks 110 are laterally confined on lower main surface 126 of the component 108 within two regions in which a respective one of two pads 120 of the component 108 is arranged, and in a surrounding portion of the component 108. Since two pads 120 are provided on the bottom main surface 126 of the component 108, two laterally confined sections of the bottom-sided galvanic connection stack 110 are provided, each assigned to a respective one of the pads 120.

Alternatively, the pads 120 of the component 108 may be constituted by a respective section of the bottom-sided galvanic connection stack 110 (not shown). In other words, a padless component 108 may be embedded in the layer body 102, and pads may be formed after embedding of the component 108 by forming laterally confined sections of a galvanic connection stack 110 directly on surface portions of the component 108 where pads 120 shall be formed.

As shown in FIG. 1 as well, a further laterally confined section of a further galvanic connection stack 110 covers an entire upper main surface 128 (being free of pads) of the component 108. Hence, the central section of the top-sided galvanic connection stack 110 directly covers exposed semiconductor material of the component 108. In the shown embodiment, the lateral extension of said central section of the top-sided galvanic connection stack 110 extends laterally beyond the sidewalls of the component 108 up to the layer body 102. Thus, said laterally confined section of the top-sided galvanic connection stack 110 protrudes laterally beyond the left and right limits of the upper main surface 128 of the component 108. Said laterally confined section of the top-sided galvanic connection stack 110 is in direct physical contact with an electrically inactive side of the component 108. The central laterally confined section of the top-sided galvanic connection stack 110 however functions for removing heat created by the component 108 during operation of the component carrier 100. The central portion of the thermally highly conductive top-sided galvanic connection stack 110 on the component 108 removes heat vertically away from the component 108 (see vertical arrow 140), whereas the side sections of the central section of the top-sided galvanic connections stack 110 extending laterally beyond the component 108 spread heat into other spatial directions (see slanted arrows 142).

As shown in FIG. 1 as well, layer body 102 comprises— as electrically conductive layer structures 104—vertical through connections 122 extending vertically through the entire core 124 of the layer body 102. The vertical through connections 122 can be copper-filled through holes in the core 124. As shown in FIG. 1, each of the vertical through connections 122 is electrically connected to a respective laterally confined section of the top-sided and of the bottom-sided galvanic connection stacks 110 to thereby form an I-shaped structure. This makes it possible to redirect electric signals from the bottom-sided pads 120 via sections of the bottom-sided galvanic connection stack 110, via the vertical through connections 122 to sections of the top-sided galvanic connection stack 110. In other words, a redistribution of electric signals from the bottom side of the component carrier 100 to the top side of the component carrier 100 can be supported by the galvanic connection stacks 110 in combination with the vertically through connections 120.

Each section of the galvanic connection stack 110 has a rectangular shape in the cross-sectional view of FIG. 1. This geometry may be defined by depositing continuous planar layers constituting the galvanic connection stacks 110, and subsequently structuring the layer sequence, for instance by lithography and etching. Furthermore, the respectively three outermost layers of the galvanic connection stacks 110 constitute a mirror symmetric layer sequence (see reference signs 116, 114, 112) on both opposing main surfaces 130, 132 of the layer body 102. Advantageously, this allows a simultaneous formation of the galvanic connection stacks 110 on both opposing main surfaces 130, 132 of the layer body 102 and on both opposing main surfaces 126, 128 of the component 108.

Next, construction of the galvanic connection stacks 110 will be described in further detail. The top-sided galvanic connection stack 110 comprises a barrier layer 118 which, on component 108, directly covers and thereby shields the semiconductor material of the component 108 for preventing oxidation and material migration. In view of the protection structure 138 on the bottom side of the component 108, a barrier layer 118 can be omitted on the bottom side.

The top-sided galvanic connection stack 110 furthermore comprises an adhesion promoting layer 116 on the barrier layer 118. The bottom-sided galvanic connection stack 110 also has an adhesion promoting layer 116 which is however formed directly on the bottom main surface 130 of the layer body 102 and on the bottom main surface 126 of the component 108. For example, the adhesion promoting layer 116 may be made of titanium or chromate. The adhesion promoting layer 116 improves adhesion of a subsequently described seed layer 114 and thereby suppresses delamination.

As already mentioned, each of the galvanic connection stacks 110 comprises a respective seed layer 114 on a respective adhesion promoting layer 116. Said seed layer 114 may for example be composed of a palladium base layer and a copper layer grown thereon by a chemical process (not shown). Alternatively, the seed layer 114 may be a physically deposited, for instance sputtered, copper layer.

Furthermore, each of the galvanic connection stacks 110 comprises a galvanically deposited main layer 112, which may for instance be made of an electrically conductive material such as copper. Each main layer 112 may be formed directly on the respective seed layer 114 by galvanic plating, using the seed layer 114 for applying an electric voltage. Main layer 112 may be formed by one or more plating stages, depending on a desired thickness.

With the described construction of the galvanic connection stacks 110, they can be advantageously formed with a stiffness gradient, wherein stiffness decreases from the layer body 102 towards an exterior side of the component carrier 100. Descriptively speaking, stiffness of the galvanic connection stacks 110 decreases in the direction of arrows 144, wherein the barrier layer 118 and the adhesion promoting layer 116 may be stiffest, and the main layer 112 may be softest (and may even have plastic properties). It has turned out that the described stiffness gradient improves the mechanical properties of the component carrier 100, in particular suppresses delamination and warpage.

As shown as well in FIG. 1, the entire sidewalls and part of a bottom side of the component 108 is directly surrounded by an electrically insulating layer structure 106 being functionalized as buffer structure 134 for buffering mechanical and/or thermal stress. Advantageously, the buffer structure 134 comprises or consists of a material which has a lower value of the Young modulus (in particular below 3 GPa, and preferably below 1 GPa) than the dielectric material of the electrically insulating layer structure 106. Thermal stress occurring during the manufacture of the component carrier 100 and/or during operation thereof may be buffered by the soft buffer structure 134, to thereby protect the embedded component 108 as well as the galvanic connection stacks 110.

Highly advantageously, the component carrier 100 does not need additional electrically insulating layer structures, for instance made of prepreg, on the galvanic connection stacks 110. This ensures a compact design of the component carrier 100, in particularly in vertical direction.

A further advantage of the component carrier 100 according to FIG. 1 is that the galvanic connection stacks 110 can be freely designed in terms of thickness and material selection for fine-tuning its intended electric and thermal properties. Consequently, the component carrier 100 is highly appropriate for power applications. The manufacture of the galvanic connection stacks 110 is simple and reliable and does not require laser processing. The galvanic connection stacks 110 may have, as a result of their manufacturing process, smooth low-roughness surfaces, rendering the component carrier 100 even more appropriate for low-loss high-frequency applications than component carriers with attached copper foils.

Still referring to FIG. 1, a portion of the bottom main surface 126 of the embedded component 108 being covered by the bottom-sided portions of the galvanic connection stack 110 may be 60% or more. Furthermore, 100% of the top main surface 128 of the embedded component 108 may be covered by the top-sided galvanic connection stack 110. This allows a reliable electric connection and an excellent heat removal and heat spreading capability of the component carrier 100.

FIG. 2 to FIG. 18 illustrate cross-sectional views of structures obtained during carrying out a method of manufacturing a component carrier 100, shown in FIG. 18, according to an exemplary embodiment of the invention.

The bottom main surface 126 of the component 108 and the bottom main surface 130 of the layer body 102 may be substantially coplanar, i.e., may lie essentially in a common plane. The top main surface 128 of the component 108 and the top main surface 132 of the layer body 102 may be exactly coplanar, i.e., may lie in a common plane. This promotes the compact design of the component carrier 100.

Apart from the vertical through connections 122, the layer body 102 in which the component 108 is embedded may be purely dielectric. The only needed electrically conductive connection structures of such an embodiment are the vertical through connections 122, and the galvanic connection stacks 110 above and below the layer body 102. Advantageously, additional electrically conductive structures (such as a lead frame, copper filled laser vias, etc.) may be dispensable in such an embodiment.

Referring to FIG. 2, a double-sided copper-cladded FR4 core 124 is shown, i.e., a fully cured plate-shaped central electrically insulating layer structure 106 with copper layers as electrically conductive layer structures 104 on both opposing main surfaces of the electrically insulating layer structure 106.

Referring to FIG. 3, registration holes 146 (which may also be denoted as alignment holes) and functional holes 148 (which may serve to provide a front-to-back side connection) may be formed in the layer body 102 of FIG. 2. For instance, this can be accomplished by mechanical drilling of the layer body 102.

Referring to FIG. 4, metallic material 150 may be applied on the exposed surface of the structure shown in FIG. 3. In particular, this can be done by copper plating. This may entirely fill the functional holes 148 with metallic material.

Referring to FIG. 5, electrically conductive material on both opposing main surfaces of the structure shown in FIG. 4 may be patterned for exposing defined surface portions of the electrically insulating layer structure 106 in recesses 152. This can be accomplished by carrying out a conformal mask photo process for cavity definition.

Referring to FIG. 6, a cavity 154 may be formed in the structure shown in FIG. 5 which will be later used for embedding a component 108. For instance, a carbon dioxide ($CO_2$) laser cutting process may be carried out for forming the cavity 154 in the layer body 102.

Referring to FIG. 7, metallic material on the surface of the structure shown in FIG. 6 may be removed. For example, this can be done by copper etching. Only the functional holes 148 remain filled with electrically conductive material, i.e., copper in the shown embodiment, to thereby form electrically conductive vertical through connections 122 extending vertically through the entire dielectric core 124 for providing an electric front-to-back connection.

Referring to FIG. 8, a temporary carrier 156, such as a sticky tape, may be attached to a bottom side of the structure shown in FIG. 7 to thereby also close a bottom of the cavity 154. For instance, attaching temporary carrier 156 may be accomplished by lamination.

Referring to FIG. 9, component 108 with pads 120 only on a bottom side, the bottom side being partially covered by a protection structure 138, is inserted into cavity 154 and is attached to an adhesive surface of the temporary carrier 156. Descriptively speaking, assembly of component 108 is carried out in a face-down configuration. Such a face-down configuration may be advantageous because this may render a process for exposing pads 120 by a laser process dispensable.

Referring to FIG. 10, a dielectric buffer structure 134 is applied to fill gaps in the cavity 154 between the component 108 and the core 124, as well as on top of the layer body 102 according to FIG. 9. For example, an appropriate resin may be applied to fill up the cavity 154 and for fixing the component 108 in place in the cavity 154. Preferably, the buffer structure 134 is made of a soft, low Young-modulus material. The buffer structure 134 may be formed by applying flowable epoxy resin, or a resin sheet to be laminated on top of the structure shown in FIG. 9.

Referring to FIG. 11, the temporary carrier 156 may be removed from the rest of the structure shown in FIG. 10. Alternatively, removing the temporary carrier 156 may also be carried out after the process executed according to FIG. 12.

Referring to FIG. 12, material may be removed from the top side of the structure shown in FIG. 11 for planarization on the top side. By this process, an upper main surface 128 of the embedded component 108 may be exposed. For example, this may be accomplished by mechanical grinding, or by chemical mechanical polishing (CMP).

Referring to FIG. 13, additional registration holes 160 may be formed in the layer body 102, for instance by mechanical drilling.

Referring to FIG. 14, a barrier layer 118 is deposited only on the upper main surface of the structure shown in FIG. 13. The barrier layer 118 serves for protecting the exposed semiconductor material on the top side of the embedded component 108. For example, the barrier layer 118 may be embodied as a titanium nitride layer formed by PVD (physical vapor deposition). Since the bottom side of the component 108 is covered by the pads 120 and by the protection structure 138, no barrier layer 118 is necessary on the bottom side.

Subsequently, an adhesion promoting layer 116 is formed on both the upper main surface of the barrier layer 118 and the lower main surface of the structure shown in FIG. 13. For example, the adhesion promoting layer 116 may be a titanium layer formed by PVD, i.e., by sputtering.

Referring to FIG. 15, a respective seed layer 114 is formed on the adhesion promoting layers 116 on each of the opposing main surfaces of the structure shown in FIG. 14. For example, the seed layer 114 may be formed of copper deposited by PVD, or may be formed as chemical copper. Hence, the electrically conductive seed layer 114 may be created by an electroless process.

Referring to FIG. 16, a respective electrically conductive galvanically deposited main layer 112 is formed on the seed layers 114 on each of the opposing main surfaces of the structure shown in FIG. 15. The main layers 112 may be formed by galvanic deposition or electroplating, in particular by copper plating using an electric current and an electrolyte. Deposition of material for the layer sequence forming the galvanic connections stacks 110 is thereby completed.

Referring to FIG. 17, the full surface galvanic connections stacks 110 shown in FIG. 16 may then be patterned on each of the two opposing main surfaces of the structure shown in FIG. 16. For instance, this may be accomplished by photo structuring, i.e., by a lithographic process. More specifically, a photoresist may be deposited on each of the opposing main surfaces of the structure shown in FIG. 16. Thereafter, defined subsections of the photoresist may be illuminated. Illuminated or non-illuminated sections of the photoresist may then be selectively removed by etching. This etching may also remove exposed surface portions of the two outermost layers 112, 114 of each of the galvanic connection stacks 110. Thereafter, the photoresist may be stripped.

Referring to FIG. 18, exposed portions of the remaining layers 116, 118 of the respective galvanic connection stack 110 may then be removed by etching.

The central portion of the obtained structure corresponds to the component carrier 100 described above referring to FIG. 1.

FIG. 19 to FIG. 29 illustrate cross-sectional views of structures obtained during carrying out a method of manufacturing a component carrier 100, shown in FIG. 29, according to another exemplary embodiment of the invention. While the embodiment of FIG. 2 to FIG. 18 is based on the embedding of component 108 in a core 124, the embodiment of FIG. 19 to FIG. 29 relates to a coreless design.

Referring to FIG. 19, the process starts with the provision of a temporary carrier 156, such as a sticky tape.

Referring to FIG. 20, component 108 (which may have the properties described referring to FIG. 1) may be attached to the temporary carrier 156 face-down, for instance may be adhered to an adhesive surface thereof. Metallic inlays which later form electrically conductive vertical through connections 122 may be also attached to the temporary carrier 156, for instance to an adhesive surface thereof. Hence, FIG. 20 illustrates assembly of component 108 and flapper inlays.

Referring to FIG. 21, an electrically insulating layer structure 106 is formed on the temporary carrier 156 to cover the component 108 and the vertical through connections 122. For example, this may be accomplished by applying a dielectric resin, for instance by coating with flowable medium (which may then be solidified by curing) or by lamination of a solid sheet.

Referring to FIG. 22, the structure shown in FIG. 21 may be planarized and thinned by removing material from the top side thereof. This material removal process may stop when the upper main surface 128 of the component 108 is exposed. Said material removal process may be carried out, for example, by grinding or by chemical mechanical polishing.

Referring to FIG. 23, the temporary carrier 156 may be removed, for instance may be peeled off. The obtained structure is similar to the structure shown in FIG. 12 (although the buffer structure 134 may be omitted according to FIG. 23).

Referring to FIG. 24, registration holes 160 (or alignment holes) are formed, for instance by mechanical drilling. The obtained central structure shown in FIG. 24 is similar to the central structure shown in FIG. 13.

Referring to FIG. 25, layers 116, 118 of the galvanic connection stacks 110 are formed, as described above referring to FIG. 14.

Referring to FIG. 26, seed layers 114 of the galvanic connection stacks 110 are formed, as described above referring to FIG. 15.

Referring to FIG. 27, galvanically deposited main layers 112 of the galvanic connection stacks 110 are formed, as described above referring to FIG. 16.

Referring to FIG. 28, the two outermost layers 112, 114 of the full-surface preforms of the laterally confined galvanic connection stacks 110 are structured, as described above referring to FIG. 17.

Referring to FIG. 29, exposed surface portions of layers 116, 118 are removed, as described above referring to FIG. 18.

The obtained component carrier 100 is similar to the one shown in FIG. 1.

FIG. 30 illustrates a bottom view of part of a component carrier 100 according to an exemplary embodiment of the invention.

More specifically, FIG. 30 shows a plan view of the bottom-sided galvanic connection stack 110 arranged on pads 120 (FIG. 30 shows a connection 120' to such a pad 120) of the embedded component 108 at the bottom main surface 126 of the component 108. Advantageously, the patterned galvanic connection stack 110 forms a redistribution structure 170 rearranging paths of electric signals propagating in the assigned horizontal plane. The redistribution structure 170 thus forms a planar redistribution layer and may form, in embodiments, a fan-out structure and/or a fan-in structure. Hence, a planar redistribution structure 170 may be formed directly at a chip plane. Such a connection architecture in one plane may allow to electrically combine different pads 120, may allow to improve registration or alignment, and may thereby allow to realize the component carrier 100 with smaller pads 120. Furthermore, this may make it possible to combine a plurality of embedded components 108 simultaneously in one plane.

Figure 31:
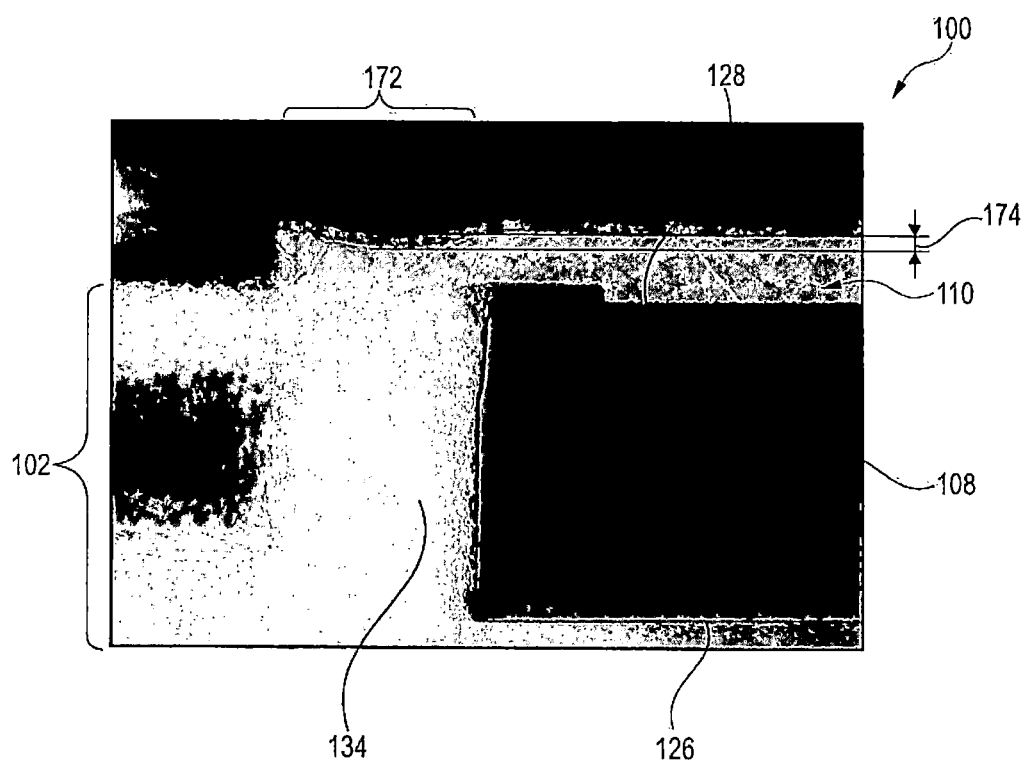
FIG. 31 illustrates a cross-sectional view of a component carrier according to an exemplary embodiment of the invention.

FIG. 31 illustrates a cross-sectional view of a component carrier 100 according to an exemplary embodiment of the invention.

As shown, a substantially horizontal galvanic connection stack 110 extends on and laterally beyond the component 108 on its upper main surface 128 and has a lateral end portion shaped as wavy structure 172. Wavy structure 172 at an edge of the former cavity 154 may be a copper track which suppresses delamination. Preferably, a vertical wave amplitude 174 of the wavy structure 172 is in a range from 2 µm to 10 µm. The wavy structure 172 around the cavity area of the component carrier 100 can be obtained by carrying out the above-described manufacturing methods, and may be pronounced in particular when a low-Young modulus material of a buffer structure 134 is located beneath the laterally protruding portion of the galvanic connection stack 110. As shown, the wavy structure 172 oscillates in a horizontal direction. In a direction perpendicular to the paper plane of FIG. 31, the wavy structure 172 may define a concave channel-shaped indentation. The wavy structure 172 in the cavity area may protect electrically conductive traces from scratches and mechanical damage. Furthermore, the wavy structure 172 may dampen a mechanical tension triggered by a CTE mismatch of different materials of component carrier 100 (in particular FR4, epoxy, silicon, etc.). Moreover, the wavy structure 172 may promote adhesion in an interior of the component carrier 100.

Figure 32:
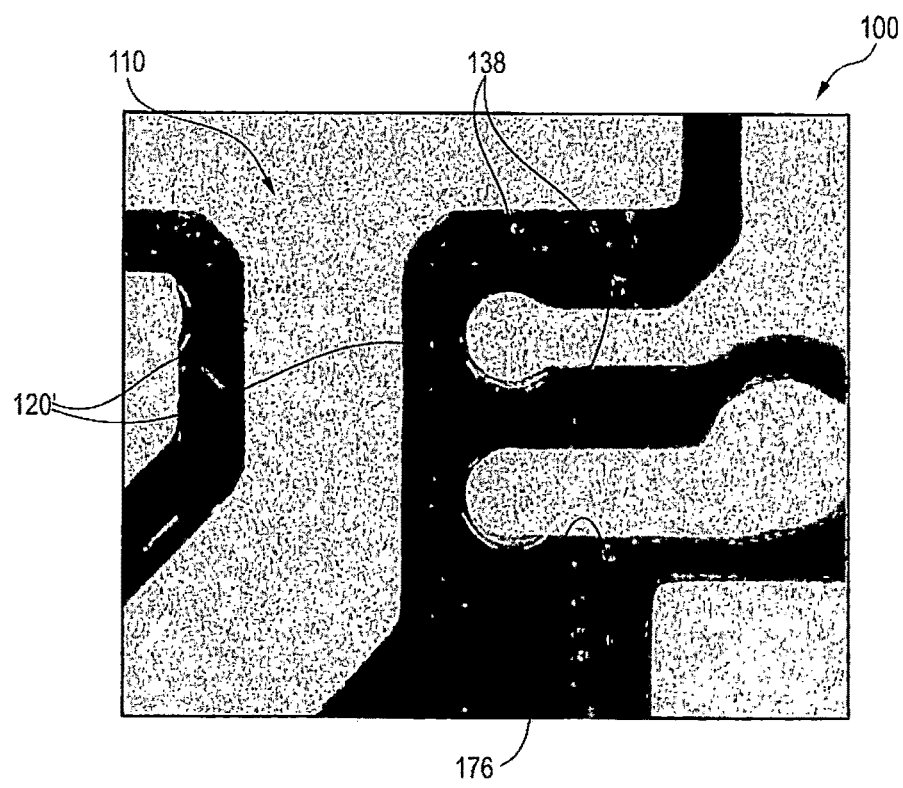
FIG. 32 illustrates a bottom view of a detail of a component carrier according to an exemplary embodiment of the invention.
Figure 33:
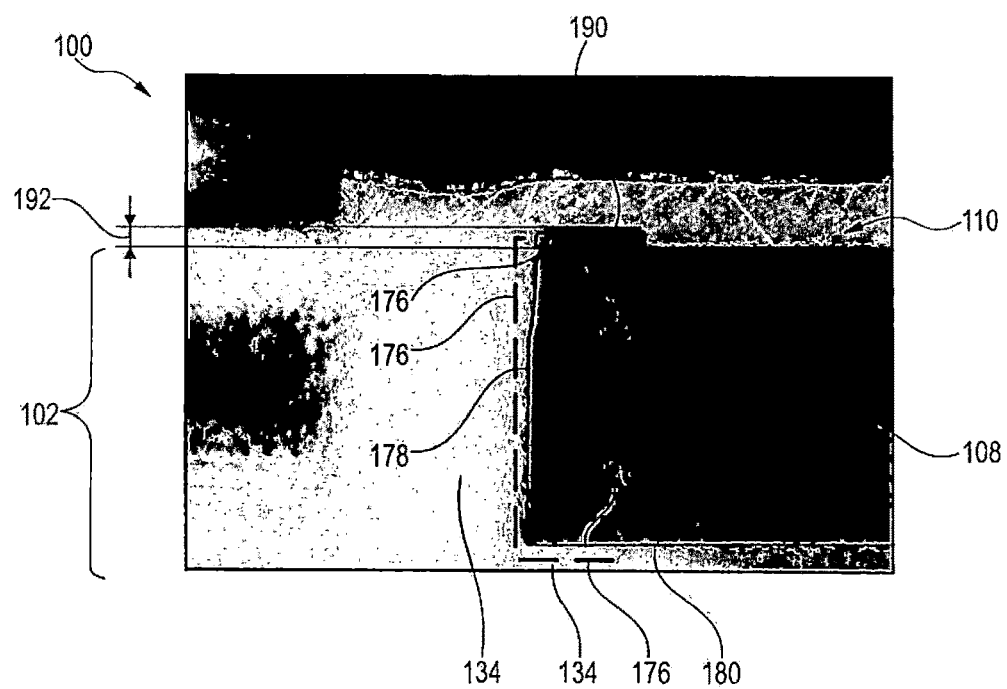
FIG. 33 illustrates a cross-sectional view of a component carrier according to an exemplary embodiment of the invention.

FIG. 32 illustrates a bottom view of a detail of a component carrier 100 according to an exemplary embodiment of the invention. FIG. 33 illustrates a cross-sectional view of a component carrier 100 according to an exemplary embodiment of the invention. A component 108 is embedded in the component carrier 100 according to FIG. 32 and FIG. 33 and can for instance be an electronic component (such as a semiconductor chip, in particular a silicon chip) or a non-electronic inlay (such as a copper block or a ceramic block, in particular a block having a metal cladding on at least part of at least one of its two opposing main surfaces, for example a copper-cladded AlN (aluminum nitride) inlay).

An oval in FIG. 32 and a substantially C-shaped dashed line in FIG. 33 indicate that the component carrier 100 may comprise a dielectric bracket 176 engaging a vertical sidewall 178 and connected horizontal portions 180, 182 of the bottom main surface 126 and the top main surface 128 of the embedded component 108. Although not shown in FIG. 33, the dielectric bracket 176 may engage the sidewall 178 and the connected portions 180, 182 in a clamping or anchoring way along an entire perimeter of the component 108. In other words, the dielectric bracket 176 may have an annular shape surrounding component 108. More specifically, a horizontal bottom portion and a vertical center portion of the dielectric bracket 176 may be made of a low-Young-modulus buffer structure 134 for buffering stress. Said buffer structure 134 may be made of a material which has a value of the Young modulus of for instance below 3 GPa. A horizontal top portion of the dielectric bracket in a region indicated with reference sign 190 may be made of resin (for instance epoxy resin).

A clamping or anchoring impact of the dielectric bracket 176 on the component 108 and the ability of the dielectric bracket 176 to adapt to the surfaces of the component 108 and the cavity 154 increases the stability of the component carrier 100. Preferably, the resin clamping structure in form of the dielectric bracket 176 is free of fibers so that a resin flow is enhanced. The provision of dielectric bracket 176 improves stability and contributes to surface leveling. As shown, an upper portion of the dielectric bracket 176 spaces the component 108 vertically with respect to the wavy lateral portion of the galvanic connection stack 110 by a distance 192. For instance, distance 192 may be in a range from 1 μm to 40 μm, preferably in a range from 2 μm to 20 μm. Distance 192 may contribute to a shielding of electric signals with respect to the component 108.

Preferably, the dielectric bracket 176 may be present on all four sides of the embedded component 108. The height of the dielectric bracket 176 may depend on the properties of a temporary carrier 156 used during manufacture (compare FIG. 34 and FIG. 35). Also, a pressure during assembly of the component 108 may have an influence on the properties of the dielectric bracket 176.

Figure 34:
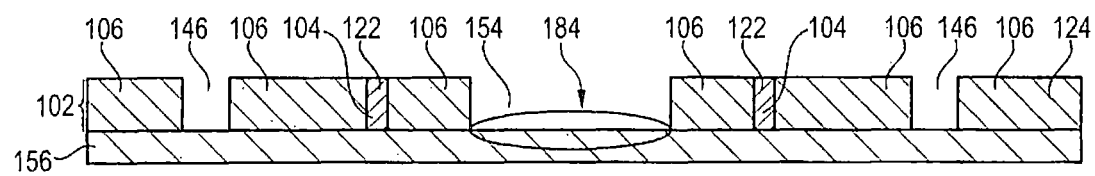
FIG. 34 and FIG. 35 illustrate cross-sectional views of structures obtained during manufacturing a component carrier according to an exemplary embodiment of the invention.
Figure 35:
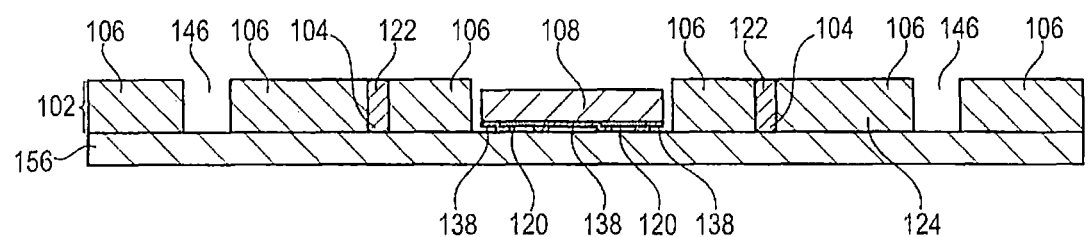

FIG. 34 and FIG. 35 illustrate cross-sectional views of structures obtained during manufacturing a component carrier 100 according to an exemplary embodiment of the invention.

During embedding the component 108, a cavity 154 formed in a layer body 102 may be closed at a bottom side by a temporary carrier 156, such as a sticky tape or a sticky sheet, see FIG. 34. Thereafter, and as shown in FIG. 35, the component 108 may be attached on a sticky attaching surface 184 of the temporary carrier 156. After having embedded component 108 in material of the component carrier 100 being manufactured, the temporary carrier 156 may be removed (for instance peeled off) before completing manufacture of the component carrier 100.

Highly preferably, the temporary carrier 156 may be configured so that a polar part of the surface energy of the attaching surface 184 of the temporary carrier 156 is smaller than or equal to 5 mN/m, that a disperse part of the surface energy of the attaching surface 184 of the temporary carrier 156 is in a range from 20 mN/m to 25 mN/m, and that an overall surface energy of the attaching surface 184 is in a range from 21 mN/m to 26 mN/m. This may promote adhesion between the assembled component 108 and the temporary carrier 156 to avoid slipping and displacement of the component 108 during processing. The mentioned properties of the temporary carrier 156 may also define advantageously the properties of dielectric bracket 176 described above.

Still referring to FIG. 34 and FIG. 35, it may be highly advantageous to select a flexural strength of the material of the temporary carrier 156 in a range from 0.4 MPa to 1.2 MPa. This may avoid wrinkles on the material of the temporary carrier 156 and may prevent tilting of components 108 during and after assembly.

Figure 36:
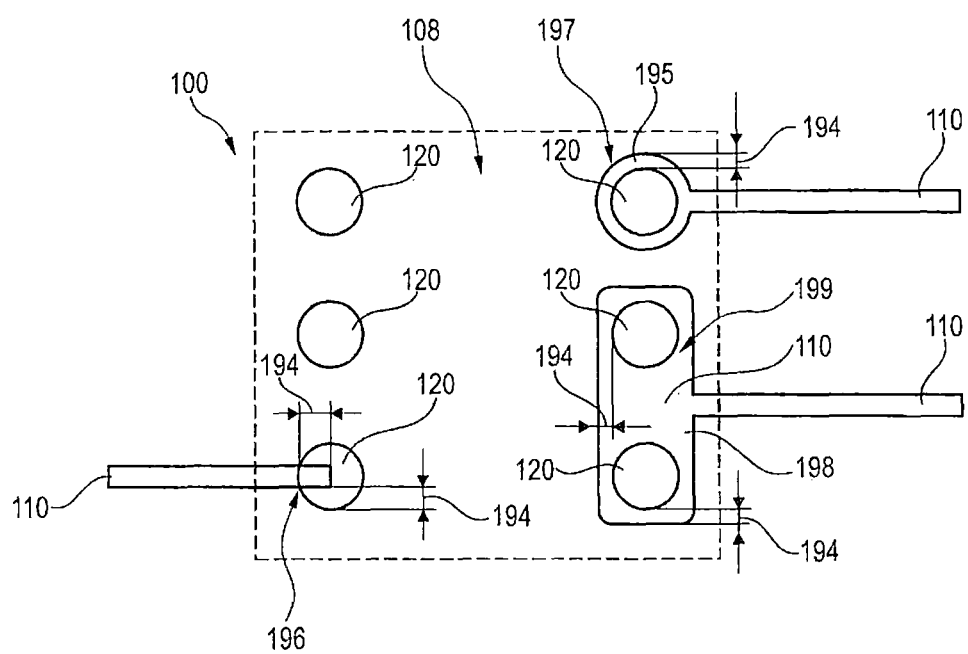
FIG. 36 illustrates a bottom view of a component embedded in a component carrier according to an exemplary embodiment of the invention.

FIG. 36 illustrates a bottom view of a component 108 embedded in a component carrier 100 according to an exemplary embodiment of the invention.

In the following and referring to FIG. 36, connection tolerances between pads 120 of component 108 with respect to the PCB design layers will be described. Advantageously, the specification may be so that tolerances of components pads 120 to PCB design layers may be larger than or equal to 10 μm. This may ensure a reliable component connection. Various tolerances are shown in FIG. 36 with reference sign 194.

The mentioned design makes it possible to connect traces of galvanic connection stack 110 to a respective pad 120 of component 108 in a leadless fashion (see reference sign 196). Other traces of galvanic connection stack 110 may be electrically connected with a respective pad 120 of component 108 by connection pads 195 (see reference sign 197). Still other traces of galvanic connection stack 110 may be electrically connected with a plurality of respective pads 120 of component 108 by combined connection pads 198 (see reference sign 199).

Figure 37:
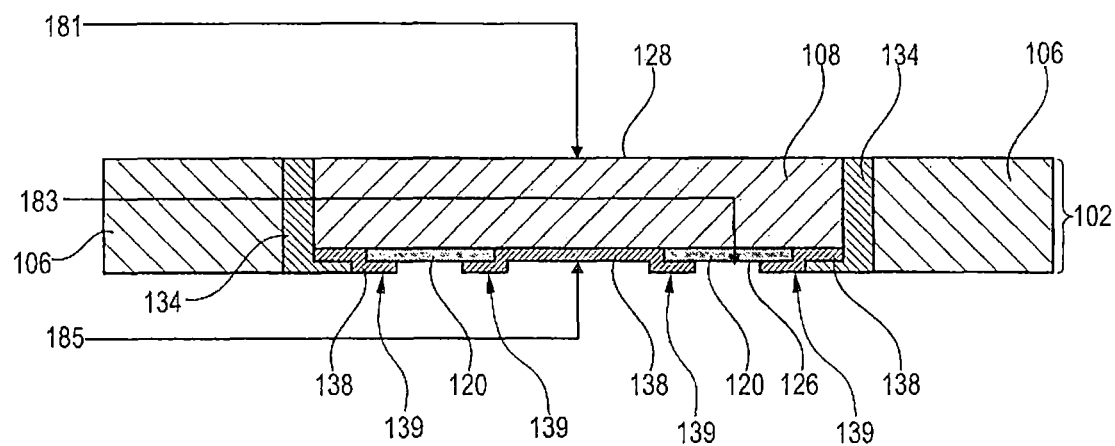
FIG. 37 illustrates a cross-sectional view of a structure obtained during manufacturing a component carrier according to an exemplary embodiment of the invention.

FIG. 37 illustrates a cross-sectional view of a structure obtained during manufacturing a component carrier 100 according to an exemplary embodiment of the invention.

FIG. 37 shows that the component 108 may comprise at its bottom main surface 126 an annular or circumferentially closed electrically insulating protection layer 138 having a stepped configuration which surround and expose pads 120 at the bottom main surface 126 of the component 108. The so formed bottom-sided protruding feet formed by electrically insulating protection layer 138 and shown with reference sign 139 may for instance be made of polyimide. When embedded in a component carrier 100, said anchoring feet 139 may contribute to a clamping or anchoring connection of the embedded component 108 within the component carrier 100 and may therefore provide additional stability. Furthermore, the annular and downwardly protruding electrically insulating protection layers 138 surrounding respective pads 120 may allow to precisely guide out the electrically conductive pads 120 for a bottom-sided electric connection. Moreover, the anchoring feet 139 may advantageously avoid delamination. During manufacture, the anchoring feet 139 may be attached to the temporary carrier 156 and may thereby leave empty spaces between temporary carrier 156 and component 108. During lamination, said empty spaces may be filled with resin, so that the anchoring feet 139 also contribute to the formation of the above-described dielectric brackets 176.

Excellent results in terms of homogeneous deposition of sputtered adhesion promoters and seed layers can be obtained when the following roughness conditions are met (in particular before a Physical Vapor Deposition (PVD) process): A roughness Ra of the (in particular semiconductor) top main surface 128 of the embedded component 108 (such as a semiconductor and in particular silicon chip) is preferably in a range from 20 nm to 130 nm, and a roughness Rz of the top main surface 128 of the embedded component 108 is preferably in a range from 200 nm to 1500 nm (see reference sign 181). Moreover, an exterior roughness Ra of the metallic pads 120 of the component 108 is preferably in a range from 20 nm to 130 nm, and a roughness Rz of said pads 120 is preferably in a range from 500 nm to 1500 nm (see reference sign 183). Furthermore, a roughness Ra of the exterior surface of the electrically insulating protection layer 138 is preferably in a range from 10 nm to 40 nm, and a roughness Rz of the exterior surface of the electrically insulating protection layer 138 is preferably in a range from 50 nm to 250 nm (see reference sign 185).

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a layer body comprising at least one electrically conductive layer structure and/or at least one electrically insulating layer structure, wherein the layer body is a laminated layer stack;
   a component embedded in the layer body; and
   at least one galvanic connection stack at least partially on at least part of at least one main surface of the layer body;
   wherein at least one of a bottom main surface and a top main surface of the embedded component is electrically connected to the at least one galvanic connection stack,
   wherein the at least one galvanic connection stack comprises a seed layer,
   wherein the bottom main surface of the component and the bottom main surface of the layer body are substantially coplanar and/or the top main surface of the component and the top main surface of the layer body are coplanar,
   wherein at least one of the at least one galvanic connection stack is arranged on at least one pad at a main surface of the component and forms a planar redistribution structure.

2. The component carrier according to claim 1, wherein the at least one galvanic connection stack comprises a galvanically deposited main layer.

3. The component carrier according to claim 1, wherein the at least one galvanic connection stack comprises a galvanically deposited main layer, and wherein the galvanically deposited main layer is arranged on the seed layer.

4. The component carrier according to claim 1, wherein the seed layer comprises at least one of a group consisting of a chemically deposited seed layer, or a physically deposited seed layer.

5. The component carrier according to claim 1, wherein the at least one galvanic connection stack comprises an adhesion promoting layer.

6. The component carrier according to claim 5, wherein the seed layer is arranged on the adhesion promoting layer.

7. The component carrier according to claim 1, wherein the at least one galvanic connection stack comprises a barrier layer arranged directly on the component between the component and the adhesion promoting layer.

8. The component carrier according to claim 1, wherein the at least one galvanic connection stack has a rectangular cross-section.

9. The component carrier according to claim 1, wherein the at least one galvanic connection stack comprises a mirror symmetric layer sequence on both opposing main surfaces of the layer body.

10. The component carrier according to claim 1, wherein at least one of the at least one galvanic connection stack comprises at least one laterally confined section arranged on at least one pad at a main surface of the component, wherein the main surface of the component at which the at least one pad is arranged is a bottom main surface.

11. The component carrier according to claim 1, comprising at least one of the following features:
   wherein at least one of the at least one galvanic connection stack covers an entire main surface of the component at which no pad of the component is arranged, wherein the at least one galvanic connection stack protrudes laterally beyond the main surface of the component at which no pad of the component is arranged;
   wherein the at least one electrically conductive layer structure comprises at least one vertical through connection extending vertically through the layer body, wherein the at least one vertical through connection is electrically connected to at least one of the at least one galvanic connection stack at both opposing main surfaces of the layer body;
   wherein at least one of the at least one galvanic connection stack provides a heat spreading structure;
   wherein the layer body comprises a core comprising fully cured dielectric material;
   wherein at least part of the component is directly surrounded by at least one of the at least one electrically insulating layer structure being functionalized as buffer structure for buffering stress, wherein the buffer structure comprises or consists of a material which has a value of the Young modulus below 8 GPa;
   wherein the at least one galvanic connection stack has a stiffness gradient with a stiffness which decreases from the layer body towards an exterior side of the component carrier;

wherein at least one of the bottom main surface and the top main surface of the embedded component is in direct physical contact with the at least one galvanic connection stack;

wherein the layer body is a laminate;

wherein the component comprises at least one pad constituted by at least part of at least one of the at least one galvanic connection stack;

wherein at least one of the at least one galvanic connection stack extends on and laterally beyond the component and has a portion comprising a wavy structure, wherein a vertical wave amplitude of the wavy structure is in a range from 1 μm to 20 μm.

12. The component carrier according to claim 1, further comprising:
  a dielectric bracket engaging a vertical sidewall and connected horizontal portions of the bottom main surface and of the top main surface of the embedded component.

13. The component carrier according to claim 12, comprising at least one of the following features:
  wherein the dielectric bracket engages the sidewall and the connected portions along an entire perimeter of the component;
  wherein at least part of the dielectric bracket is formed by a buffer structure for buffering stress, wherein the buffer structure comprises a material which has a value of the Young modulus below 8 GPa.

14. The component carrier according to claim 1, comprising at least one of the following features:
  wherein a portion of the bottom main surface of the embedded component being covered by one of the at least one galvanic connection stack is at least 60%;
  wherein a portion of the top main surface of the embedded component being covered by one of the at least one galvanic connection stack is more than 90%.

15. The component carrier according to claim 1, comprising at least one of the following features:
  wherein a roughness Ra of the top main surface of the embedded component is in a range from 20 nm to 130 nm and/or a roughness Rz of the top main surface of the embedded component is in a range from 200 nm to 1500 nm;
  wherein a roughness Ra of at least one pad at a main surface of the component is in a range from 20 nm to 130 nm and/or a roughness Rz of at least one pad at a main surface of the component is in a range from 500 nm to 1500 nm;
  wherein a roughness Ra of an electrically insulating protection layer of the component at a main surface of the component is in a range from 10 nm to 40 nm and/or a roughness Rz of an electrically insulating protection layer of the component at a main surface of the component is in a range from 50 nm to 250 nm.

16. The component carrier according to claim 1, comprising at least one of the following features:
  wherein the component comprises at least one circumferentially closed electrically insulating protection layer having a vertically stepped configuration, surrounding at least one pad at a main surface of the component;
  wherein the component comprises at least one electrically insulating protection layer at a main surface of the component and forming at least one protruding anchoring foot;
  wherein the component comprises at least one pad connected to at least one of the at least one galvanic connection stack and having a shape of a group consisting of a circular shape and a non-circular shape;
  wherein the component comprises a plurality of pads connected to at least one of the at least one galvanic connection stack, wherein at least two of the pads are electrically connected with each other by a section of said at least one galvanic connection stack.

17. A method of manufacturing a component carrier, the method comprising:
  providing a layer body comprising at least one electrically conductive layer structure and/or at least one electrically insulating layer structure, wherein the layer body is a laminated layer stack;
  embedding a component in the layer body;
  wherein the bottom main surface of the component and the bottom main surface of the layer body are substantially coplanar and/or the top main surface of the component and the top main surface of the layer body are coplanar, and
  forming at least one galvanic connection stack at least partially on at least part of at least one main surface of the layer body and electrically connected to at least one of a bottom main surface and a top main surface of the embedded component, wherein the at least one galvanic connection stack comprises a seed layer,
  wherein at least one of the at least one galvanic connection stack is arranged on at least one pad at a main surface of the component and forms a planar redistribution structure.

18. The method according to claim 17, wherein embedding the component comprises temporarily attaching the component on a temporary carrier, and removing the temporary carrier before completing manufacture of the component carrier.

19. The method according to claim 18, wherein the method comprises using a temporary carrier having at least one of the following properties:
  a polar part of the surface energy of an attaching surface of the temporary carrier is smaller than 10 mN/m;
  a disperse part of the surface energy of an attaching surface of the temporary carrier is in a range from 15 mN/m to 30 mN/m;
  an overall surface energy of an attaching surface of the temporary carrier is in a range from 15 mN/m to 40 mN/m;
  a flexural strength of material of the temporary carrier is in a range from 0.1 MPa to 5 MPa.

* * * * *